United States Patent
Donowho et al.

(10) Patent No.: US 8,003,890 B2
(45) Date of Patent: Aug. 23, 2011

(54) REPOSITIONABLE SHELF-MOUNTED HANDLE SPOOL ASSEMBLY FOR CABLE ROUTING

(75) Inventors: D. Brian Donowho, Austin, TX (US); Richard E. Lewis, II, Austin, TX (US)

(73) Assignee: Chatsworth Products, Inc., Westlake Village, CA (US)

( * ) Notice: Subject to any disclaimer, the term of this patent is extended or adjusted under 35 U.S.C. 154(b) by 310 days.

(21) Appl. No.: 12/349,619

(22) Filed: Jan. 7, 2009

(65) Prior Publication Data

US 2009/0224110 A1    Sep. 10, 2009

Related U.S. Application Data

(60) Provisional application No. 61/020,741, filed on Jan. 13, 2008, provisional application No. 61/019,592, filed on Jan. 7, 2008, provisional application No. 61/019,596, filed on Jan. 7, 2008.

(51) Int. Cl.
    *H02G 3/00* (2006.01)
(52) U.S. Cl. .......................... 174/100; 248/68.1; 211/26
(58) Field of Classification Search .................. 16/412; 292/336.3, 347; 312/223.14
    See application file for complete search history.

(56) References Cited

U.S. PATENT DOCUMENTS

| | | | |
|---|---|---|---|
| 1,164,849 A | * | 12/1915 | Nilsen .............................. 70/487 |
| 1,611,549 A | * | 12/1926 | Moore .......................... 292/347 |
| 1,878,394 A | * | 9/1932 | Haan, Jr. ....................... 292/347 |
| D131,217 S | | 1/1942 | Braun |
| 2,270,802 A | | 1/1942 | Kristensen |
| 2,531,110 A | | 11/1950 | Cisler |
| 2,921,607 A | | 1/1960 | Caveney |
| 3,659,319 A | | 5/1972 | Erickson |
| 4,002,856 A | | 1/1977 | Sedlacek et al. |
| 4,013,253 A | | 3/1977 | Perrault et al. |
| 4,039,131 A | | 8/1977 | Perrault et al. |
| 4,470,102 A | | 9/1984 | De Luca et al. |
| 4,641,225 A | | 2/1987 | Reichle |
| 4,641,754 A | | 2/1987 | Hebel et al. |
| 4,675,900 A | | 6/1987 | Temkin |

(Continued)

FOREIGN PATENT DOCUMENTS

WO    0101534    1/2001

(Continued)

OTHER PUBLICATIONS

Information Disclosure Statement (IDS) Letter Regarding Common Patent Application(s), dated Sep. 1, 2010.

(Continued)

*Primary Examiner* — Terrell McKinnon
*Assistant Examiner* — Erin W Smith
(74) *Attorney, Agent, or Firm* — Tillman Wright, PLLC; James D. Wright; Chad D. Tillman

(57) ABSTRACT

A repositionable shelf-mounted handle spool assembly for cable routing includes a mounting bracket and a repositionable spool coupled thereto. The mounting bracket has a primary mounting plate and a shelf, having an opening, that is parallel to but spaced apart from the primary mounting plate. The repositionable spool includes a base having a stub for repositionably coupling with the opening in the shelf, a cylindrical shaft extending from the base, and a gate arm mounted perpendicularly to the cylindrical shaft. The base may be repositioned relative to the mounting structure via the stub.

17 Claims, 21 Drawing Sheets

U.S. PATENT DOCUMENTS

| | | | |
|---|---|---|---|
| D292,550 S | 11/1987 | Jackson | |
| 4,709,888 A | 12/1987 | Cubit et al. | |
| D331,006 S | 11/1992 | Dziedzic | |
| D332,904 S | 2/1993 | Plummer et al. | |
| 5,639,132 A * | 6/1997 | Wartian | 292/347 |
| 5,740,994 A | 4/1998 | Laughlin | |
| 5,788,087 A | 8/1998 | Orlando | |
| 5,831,216 A | 11/1998 | Hoffmann | |
| 5,902,961 A | 5/1999 | Viklund et al. | |
| 5,904,232 A * | 5/1999 | Shen | 192/69.62 |
| 5,921,402 A | 7/1999 | Magenheimer | |
| 6,011,221 A | 1/2000 | Lecinski et al. | |
| 6,067,233 A | 5/2000 | English et al. | |
| 6,102,214 A | 8/2000 | Mendoza | |
| 6,127,631 A | 10/2000 | Green et al. | |
| 6,181,862 B1 | 1/2001 | Noble et al. | |
| D439,503 S | 3/2001 | Paliga et al. | |
| D439,504 S | 3/2001 | Caveney | |
| D440,210 S | 4/2001 | Larsen et al. | |
| 6,215,069 B1 | 4/2001 | Martin et al. | |
| 6,245,998 B1 | 6/2001 | Curry et al. | |
| 6,318,680 B1 | 11/2001 | Benedict et al. | |
| 6,347,714 B1 | 2/2002 | Fournier et al. | |
| 6,365,834 B1 | 4/2002 | Larsen et al. | |
| 6,398,149 B1 | 6/2002 | Hines et al. | |
| D463,253 S | 9/2002 | Canty | |
| 6,467,633 B1 | 10/2002 | Mendoza | |
| 6,468,112 B1 | 10/2002 | Follingstad et al. | |
| 6,489,565 B1 | 12/2002 | Krietzman et al. | |
| 6,501,899 B1 | 12/2002 | Marrs et al. | |
| 6,584,267 B1 | 6/2003 | Caveney et al. | |
| 6,600,107 B1 | 7/2003 | Wright et al. | |
| 6,605,782 B1 | 8/2003 | Krietzman et al. | |
| 6,614,978 B1 | 9/2003 | Caveney et al. | |
| 6,708,830 B2 | 3/2004 | Mendoza | |
| 6,760,531 B1 | 7/2004 | Solheid et al. | |
| 6,766,093 B2 | 7/2004 | McGrath et al. | |
| 6,796,437 B2 | 9/2004 | Krampotich et al. | |
| 6,866,541 B2 | 3/2005 | Barker et al. | |
| 6,884,942 B2 | 4/2005 | McGrath et al. | |
| 6,918,796 B2 | 7/2005 | Elliot et al. | |
| 6,946,605 B2 | 9/2005 | Levesque et al. | |
| 6,964,588 B2 | 11/2005 | Follingstad et al. | |
| 6,968,647 B2 | 11/2005 | Levesque et al. | |
| 6,981,893 B2 | 1/2006 | Barker et al. | |
| 6,997,024 B2 * | 2/2006 | Etlicher | 70/210 |
| 7,000,784 B2 | 2/2006 | Canty et al. | |
| 7,019,213 B1 | 3/2006 | McNutt et al. | |
| 7,026,553 B2 | 4/2006 | Levesque et al. | |
| 7,083,051 B2 | 8/2006 | Smith et al. | |
| 7,119,282 B2 | 10/2006 | Krietzman et al. | |
| 7,120,348 B2 | 10/2006 | Trebesch et al. | |
| 7,152,936 B2 | 12/2006 | Tarawicz | |
| 7,178,679 B2 | 2/2007 | Canty et al. | |
| D539,228 S | 3/2007 | Toikka et al. | |
| 7,220,150 B2 | 5/2007 | Follingstad et al. | |
| 7,225,586 B2 | 6/2007 | Levesque et al. | |
| 7,285,027 B2 | 10/2007 | McGrath et al. | |
| 7,362,941 B2 | 4/2008 | Rinderer et al. | |
| 7,378,046 B2 | 5/2008 | Canty et al. | |
| 7,381,100 B2 | 6/2008 | Follingstad et al. | |
| 7,417,188 B2 | 8/2008 | McNutt et al. | |
| 7,425,678 B2 | 9/2008 | Adducci et al. | |
| 7,427,713 B2 | 9/2008 | Adducci et al. | |
| 7,458,859 B2 | 12/2008 | McGrath et al. | |
| 7,485,803 B2 | 2/2009 | Adducci et al. | |
| 7,495,169 B2 | 2/2009 | Adducci et al. | |
| 7,504,581 B2 | 3/2009 | Adducci et al. | |
| 7,687,716 B2 | 3/2010 | Pepe et al. | |
| 7,762,405 B2 | 7/2010 | Vogel et al. | |
| D629,289 S | 12/2010 | Krietzman et al. | |
| D630,167 S | 1/2011 | Donowho | |
| D630,173 S | 1/2011 | Donowho et al. | |
| D632,660 S | 2/2011 | Donowho et al. | |
| 7,893,356 B2 | 2/2011 | Garza et al. | |
| D635,935 S | 4/2011 | Donowho | |
| 2002/0020038 A1 * | 2/2002 | Wilkes | 16/412 |
| 2002/0176681 A1 | 11/2002 | Puetz et al. | |
| 2002/0197045 A1 | 12/2002 | Schmidt et al. | |
| 2003/0190036 A1 | 10/2003 | Mandoza | |
| 2004/0007372 A1 | 1/2004 | Krietzman et al. | |
| 2004/0011547 A1 | 1/2004 | Wright | |
| 2004/0050808 A1 | 3/2004 | Krampotich et al. | |
| 2004/0094491 A1 | 5/2004 | Smith et al. | |
| 2004/0123427 A1 * | 7/2004 | Lee | 16/412 |
| 2004/0173545 A1 | 9/2004 | Canty et al. | |
| 2004/0183409 A1 | 9/2004 | Rinderer | |
| 2004/0190270 A1 | 9/2004 | Aldag et al. | |
| 2004/0201335 A1 | 10/2004 | Davis | |
| 2005/0006323 A1 | 1/2005 | Abby et al. | |
| 2005/0115152 A1 | 6/2005 | Levesque et al. | |
| 2005/0115737 A1 | 6/2005 | Levesque et al. | |
| 2005/0221683 A1 | 10/2005 | McGrath et al. | |
| 2005/0247650 A1 | 11/2005 | Vogel et al. | |
| 2005/0259383 A1 | 11/2005 | Ewing | |
| 2006/0054336 A1 | 3/2006 | McNutt et al. | |
| 2006/0059802 A1 | 3/2006 | McNutt et al. | |
| 2006/0091086 A1 | 5/2006 | Canty et al. | |
| 2006/0162948 A1 | 7/2006 | Rinderer et al. | |
| 2006/0171651 A1 | 8/2006 | Laursen | |
| 2007/0210679 A1 | 9/2007 | Adducci et al. | |
| 2007/0210680 A1 | 9/2007 | Appino et al. | |
| 2007/0210681 A1 | 9/2007 | Adducci et al. | |
| 2007/0210683 A1 | 9/2007 | Adducci et al. | |
| 2007/0210686 A1 | 9/2007 | Adducci et al. | |
| 2007/0212010 A1 | 9/2007 | Caveney et al. | |
| 2007/0221393 A1 | 9/2007 | Adducci et al. | |
| 2007/0249237 A1 | 10/2007 | Follingstad et al. | |
| 2008/0174217 A1 | 7/2008 | Walker | |
| 2009/0093169 A1 | 4/2009 | McGrath et al. | |
| 2009/0236117 A1 | 9/2009 | Garza et al. | |
| 2009/0273915 A1 | 11/2009 | Dean, Jr. et al. | |
| 2010/0193754 A1 | 8/2010 | Garza et al. | |
| 2010/0200707 A1 | 8/2010 | Garza et al. | |

FOREIGN PATENT DOCUMENTS

| | | |
|---|---|---|
| WO | 02052866 | 7/2002 |
| WO | 2009089008 A2 | 7/2009 |
| WO | 2009089306 A1 | 7/2009 |
| WO | 2009089307 A2 | 7/2009 |
| WO | 2009089307 A3 | 12/2009 |

OTHER PUBLICATIONS

Information Disclosure Statement (IDS) Letter Regarding Common Patent Applications(s), dated Mar. 8, 2011.

"International Search Report" and "Written Opinion" of the International Searching Authority (Korean Intellectual Property Office) in Chatsworth Products, Inc. et al., International Patent Application Serial No. PCT/US2009/030369, filed on Jan. 7, 2009 mailed on Oct. 12, 2009 and completed on Oct. 9, 2009, 9 pages.

Information Disclosure Statement (IDS) Letter Regarding Common Patent Application(s), dated Dec. 14, 2010.

"International Search Report" and "Written Opinion of the International Search Authority" (European Patent Office) in Corning Cable Systems LLC, International Patent Application Serial No. PCT/US2009/000075, dated Aug. 7, 2009, 21 pages.

* cited by examiner

REPOSITIONABLE SHELF-MOUNTED HANDLE SPOOL ASSEMBLY FOR CABLE ROUTING

CROSS-REFERENCE TO RELATED APPLICATION

The present application is a U.S. nonprovisional patent application of, and claims priority under 35 U.S.C. §119(e) to, U.S. provisional patent application Ser. No. 61/019,592, filed Jan. 7, 2008, U.S. provisional patent application Ser. No. 61/019,596, filed Jan. 7, 2008, and U.S. provisional patent application Ser. No. 61/020,741, filed Jan. 13, 2008, each of which is incorporated by reference herein.

The entirety of each of the following patent applications are incorporated by reference herein:
- U.S. Design patent application Ser. No. 29/299,950 to Alaniz et al., filed Jan. 7, 2008;
- U.S. Design patent application Ser. No. 29/302,236 to Donowho et al., filed Jan. 14, 2008;
- U.S. Design patent application Ser. No. 29/302,304 to Donowho et al., filed Jan. 14, 2008;
- U.S. Design patent application Ser. No. 29/302,305 to Lawrence et al., filed Jan. 14, 2008;
- U.S. Design patent application Ser. No. 29/302,309 to Lewis II et al., filed Jan. 14, 2008;
- U.S. Patent Application No. 61/019,599 to Garza et al., filed Jan. 7, 2008;
- U.S. Patent Application No. 61/020,745 to Garza et al., filed Jan. 14, 2008; and
- U.S. Patent Application No. 61/095,308 to Donowho, filed Sep. 8, 2008.

COPYRIGHT STATEMENT

All of the material in this patent document is subject to copyright protection under the copyright laws of the United States and of other countries. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE PRESENT INVENTION

1. Field of the Present Invention

The present invention relates generally to supporting and routing cable within an electronic equipment cabinet, and, in particular, to a utilizing a handle spool assembly within an electronic equipment cabinet to support and route cable.

2. Background

Frames and cabinets (sometimes collectively referred to hereinafter as "enclosures") for mounting and storing electronic components have been built in many different sizes and with many different proportions in order to best accommodate the components which they are designed to store. Components stored in these enclosures may include audio and video equipment and the like, but quite frequently include computer equipment and related peripheral devices. Regardless of the component type, each component typically requires an external power supply and a plurality of input and output cables, wires and the like (generally referred to hereinafter as "cables"). Some of these wires and cables are connected to other components in the same enclosure, and some of which extend out of the enclosure to either an adjacent enclosure or to a remote location, typically using either an overhead cabling system or an under-floor cabling system.

Apparatuses for routing cables and wires to and from the equipment are also well known. Cables are generally routed in the vertical direction to a point adjacent to the desired equipment and then routed in the horizontal direction to the desired equipment. A particular problem inherent in the use of enclosures of all kinds is the issue of how to route and otherwise manage the large quantities of cables that are often necessary for a particular enclosure.

One device that is used to route cable is a cable management spool. Currently available cable management spools typically require several components to facilitate structurally supporting cables and cable routing maintenance. Typically these systems fell into two categories, ones that use fasteners and require tools to install and adjust, and those that were of a tool-less, snap in design. The designs that required several parts (including mounting hardware) have an inherent cost penalty due to the cost of the parts, assembly, and adjustment labor. Although the minimal part count "snap-in" spool systems have been employed in the past, these systems typically incorporate a fixed finger position or do not incorporate an indexing feature to locate the spool arm in repeatable, known locations.

Unfortunately, available cable management spools do not afford a minimal part count while providing an indexing arm feature. It would be advantageous to minimize part count because the assembly of the system is would be greatly simplified and costs would be minimized. Further providing an indexing feature to control the angular position of the spool finger would promote a consistent look for an installation because the arm feature could be positioned consistently and repeatably.

SUMMARY OF THE INVENTION

Broadly defined, the present invention according to one aspect includes a repositionable shelf-mounted handle spool assembly for cable routing having a mounting bracket and a repositionable spool coupled to the mounting bracket. The repositionable spool has a base, a cylindrical shaft extending from the base, and a spool head mounted to the cylindrical shaft in a fixed position. The base may be repositioned relative to the mounting bracket.

In features of this aspect, the handle spool assembly may be configured for use in an electric equipment enclosure; the handle spool assembly may be configured for use in a vertical cable manager; the spool head may be a gate arm; the gate arm may be mounted perpendicularly relative to the cylindrical shaft; and the base, the shaft, and the spool head may be integrally formed.

In other features of this aspect, the mounting bracket may include a spool opening that receives the base; the spool opening may include a plurality of recesses arranged around the periphery thereof; the cylindrical shaft may include a cylindrical stud at an end thereof having a plurality of resilient bosses arranged circumferentially to correspond with the recesses of the spool opening, each boss being depressable radially inwardly relative to the cylindrical stub for snap-fitting the repositionable spool to the mounting bracket; the repositionable spool may be rotatable relative to the mounting bracket to reposition the spool; rotation of the repositionable spool may be indexed as the bosses engage recesses of the spool opening; and the repositionable spool may be repositioned to at least four rotational orientations.

Broadly defined, the invention according to another aspect includes a repositionable shelf-mounted handle spool assembly for cable routing having a mounting bracket and one or more repositionable spools. The mounting bracket has a primary mounting plate and a handle spool shelf, and the repositionable spools are coupled to and repositionable relative to the handle spool shelf. Each repositionable spool includes a base, a cylindrical shaft extending from the base, and a spool head mounted to the cylindrical shaft in a fixed position.

In features of this aspect, the spool head of at least one of the one or more repositionable spools may be a gate arm; the handle spool assembly may be configured for use in an electric equipment enclosure; the handle spool assembly may be configured for use in a vertical cable manager; and the shelf may be generally parallel to but spaced apart from the primary mounting plate.

Broadly defined, the present invention according to another aspect includes a repositionable shelf-mounted handle spool for cable routing having a base having a stub for repositionably coupling with an opening in a mounting structure, a cylindrical shaft extending from the base, and a spool head mounted generally perpendicularly to the cylindrical shaft in a fixed position. The base may be repositioned relative to the mounting structure via the stub.

In features of this aspect, the handle spool assembly may be configured for use in an electric equipment enclosure; and the handle spool assembly may be configured for use in a vertical cable manager.

Broadly defined, the present invention according to still another aspect includes a vertical cable manager having a repositionable shelf-mounted assembly. The repositionable shelf-mounted assembly has a mounting bracket and a repositionable spool coupled to the mounting bracket. The repositionable spool includes a base that is repositionable relative to the mounting bracket, a cylindrical shaft extending from the base, and a spool head mounted to the cylindrical shaft in a fixed position.

In features of this aspect, the spool head may be a gate arm; the gate arm may be mounted perpendicularly relative to the cylindrical shaft; and the base, the shaft, and the spool head may be integrally formed.

In other features of this aspect, the mounting bracket may include a spool opening that receives the base; the spool opening may include a plurality of recesses arranged around the periphery thereof; the cylindrical shaft may include a cylindrical stud at an end thereof having a plurality of resilient bosses arranged circumferentially to correspond with the recesses of the spool opening, each boss being depressable radially inwardly relative to the cylindrical stub for snap-fitting the repositionable spool to the mounting bracket; the repositionable spool may be rotatable relative to the mounting bracket to reposition the spool; rotation of the repositionable spool may be indexed as the bosses engage recesses of the spool opening; and the repositionable spool may be repositioned to at least four rotational orientations.

Broadly defined, the present invention according to still yet another aspect includes an electric equipment enclosure having a repositionable shelf-mounted assembly. The repositionable shelf-mounted assembly has a mounting bracket and a repositionable spool coupled to the mounting bracket. The repositionable spool includes a base that is repositionable relative to the mounting bracket, a cylindrical shaft extending from the base, and a spool head mounted to the cylindrical shaft in a fixed position.

In features of this aspect, the spool head may be a gate arm; the gate arm may be mounted perpendicularly relative to the cylindrical shaft; and the base, the shaft, and the spool head may be integrally formed.

In other features of this aspect, the mounting bracket may include a spool opening that receives the base; the spool opening may include a plurality of recesses arranged around the periphery thereof; the cylindrical shaft may include a cylindrical stud at an end thereof having a plurality of resilient bosses arranged circumferentially to correspond with the recesses of the spool opening, each boss being depressable radially inwardly relative to the cylindrical stub for snap-fitting the repositionable spool to the mounting bracket; the repositionable spool may be rotatable relative to the mounting bracket to reposition the spool; rotation of the repositionable spool may be indexed as the bosses engage recesses of the spool opening; and the repositionable spool may be repositioned to at least four rotational orientations.

BRIEF DESCRIPTION OF THE DRAWINGS

Further features, embodiments, and advantages of the present invention will become apparent from the following detailed description with reference to the drawings, which are not necessarily to scale, wherein.

DETAILED DESCRIPTION OF THE PREFERRED EMBODIMENTS

Figure 1:
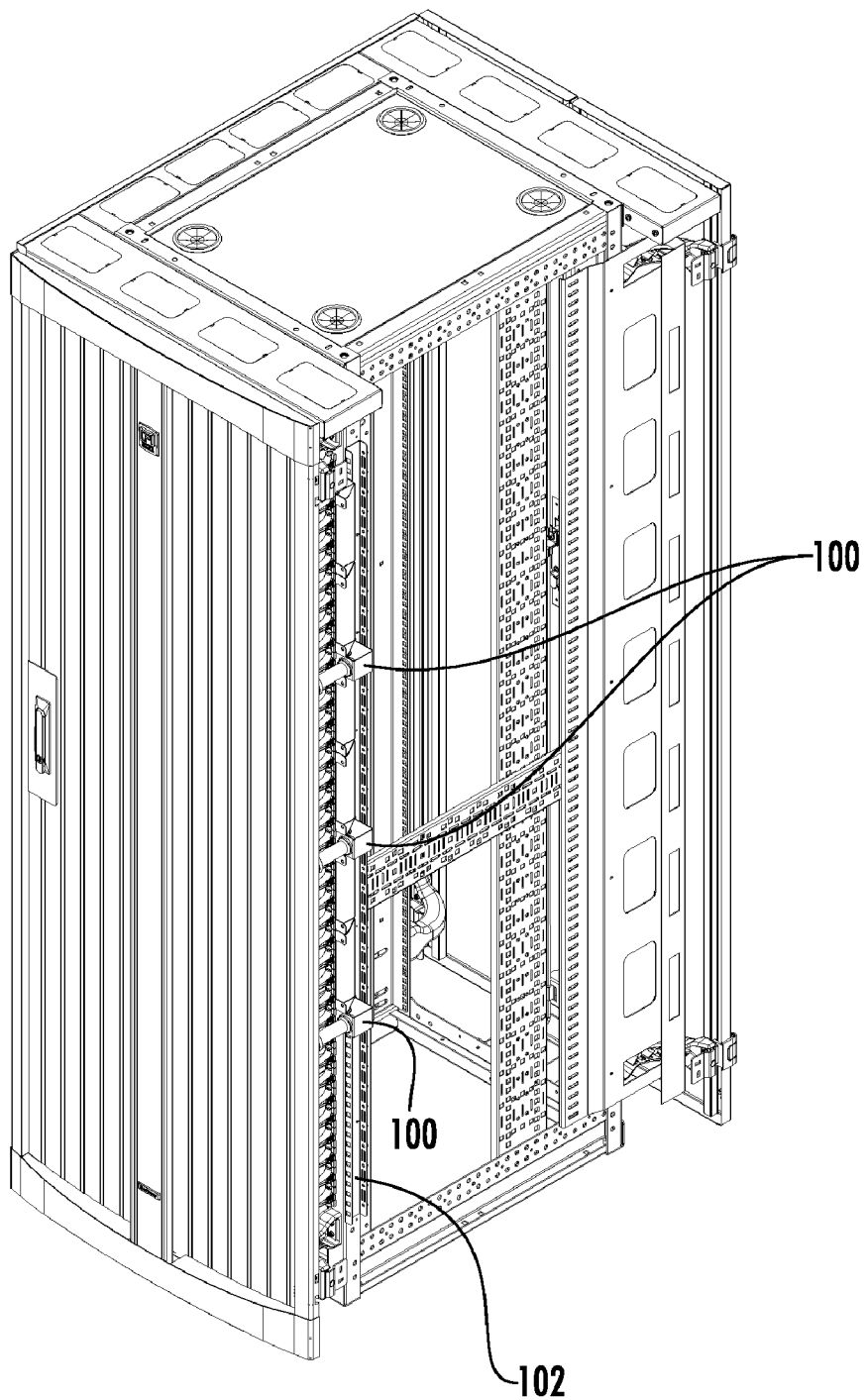
FIG. 1 is an isometric view of an electric equipment enclosure including several repositionable shelf-mounted handle spool assemblies, for cable routing, in accordance with a first preferred embodiment of the present invention.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of the preferred embodiment(s) is merely exemplary in nature and is in no way intended to limit the invention, its application, or uses.

Figure 2:
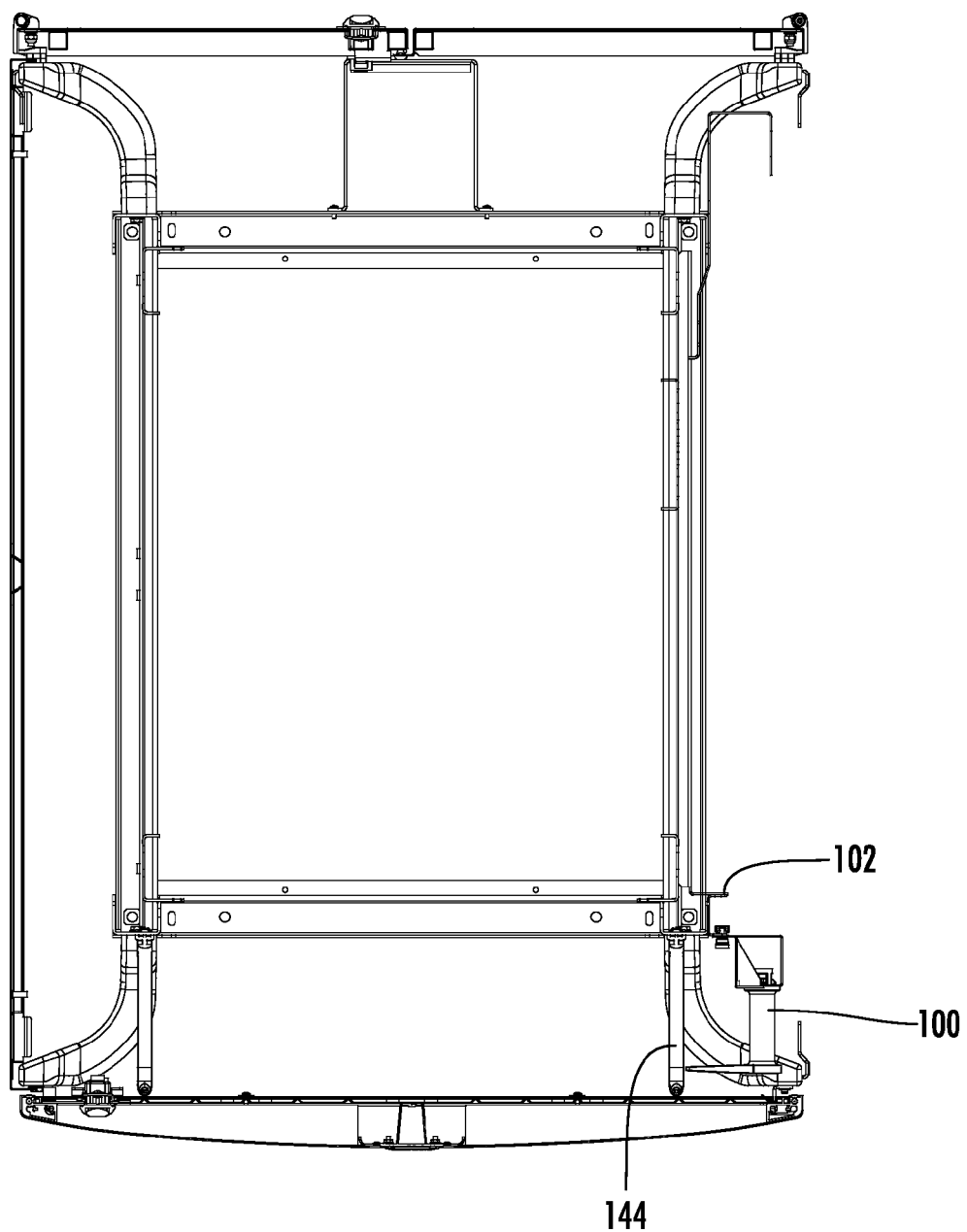
FIG. 2 is a top cross-sectional view of the electric equipment enclosure of FIG. 1.

FIGS. 1 and 2 are an isometric view and a top cross-sectional view, respectively, of an electric equipment enclosure including several repositionable shelf-mounted handle spool assemblies 100, for cable routing, in accordance with a first preferred embodiment of the present invention. As shown therein, a side panel of the expanded equipment cabinet is removed in order to better show the handle spool assembly 100 of the present invention. The expanded equipment cabinet is fully disclosed and described in commonly-assigned patent application Ser. No. 11/837,538, the entirety of which is incorporated herein by reference.

In brief summary, the expanded cabinet includes an interior four post frame structure and a cabinet expansion kit. The expansion kit creates side panel space in the cabinet wherein the handle spool assembly 100 may be mounted.

The interior four post frame structure may be of conventional design and construction. As shown and described, the four post frame structure is formed from a plurality of frame members including four vertical members, upper and lower front cross members, upper and lower rear cross members and two pairs of upper and lower side cross members. Each vertical member includes a plurality of cross member attachment apertures at each end. Two of the vertical members are connected together at their upper and lower ends by the upper and lower front cross members, respectively, and the other two vertical members are connected together at their upper and lower ends by the upper and lower rear cross members, respectively. The front cross members and their respective vertical members thus define a front frame, and the rear cross members and their respective vertical members define a rear frame. The front and rear frames may then be connected together at their respective corners by the upper and lower side cross members.

Any known connection means may be used to join the various members together. Although not illustrated herein, at least one example of conventional connection means is described in commonly-assigned U.S. Pat. No. 6,185,098, the entirety of which is incorporated herein by reference. Although likewise not illustrated herein, the precision and the stability of each of the corners of at least some types of four post frame structures may be enhanced by utilizing a self-squaring corner attachment bracket such as that disclosed by the commonly-assigned U.S. Pat. No. 5,997,117 entitled "RACK FRAME CABINET," the entirety of which is hereby incorporated by reference.

The expanded cabinet includes a fiber management system mounted in side panel space of the cabinet. The fiber management system includes a vertical accessory rail 102 that is connected to and vertically aligned with the left front post of the four post frame. A plurality of handle spool assemblies 100 are mounted to the vertical accessory rail 102.

Figure 3:
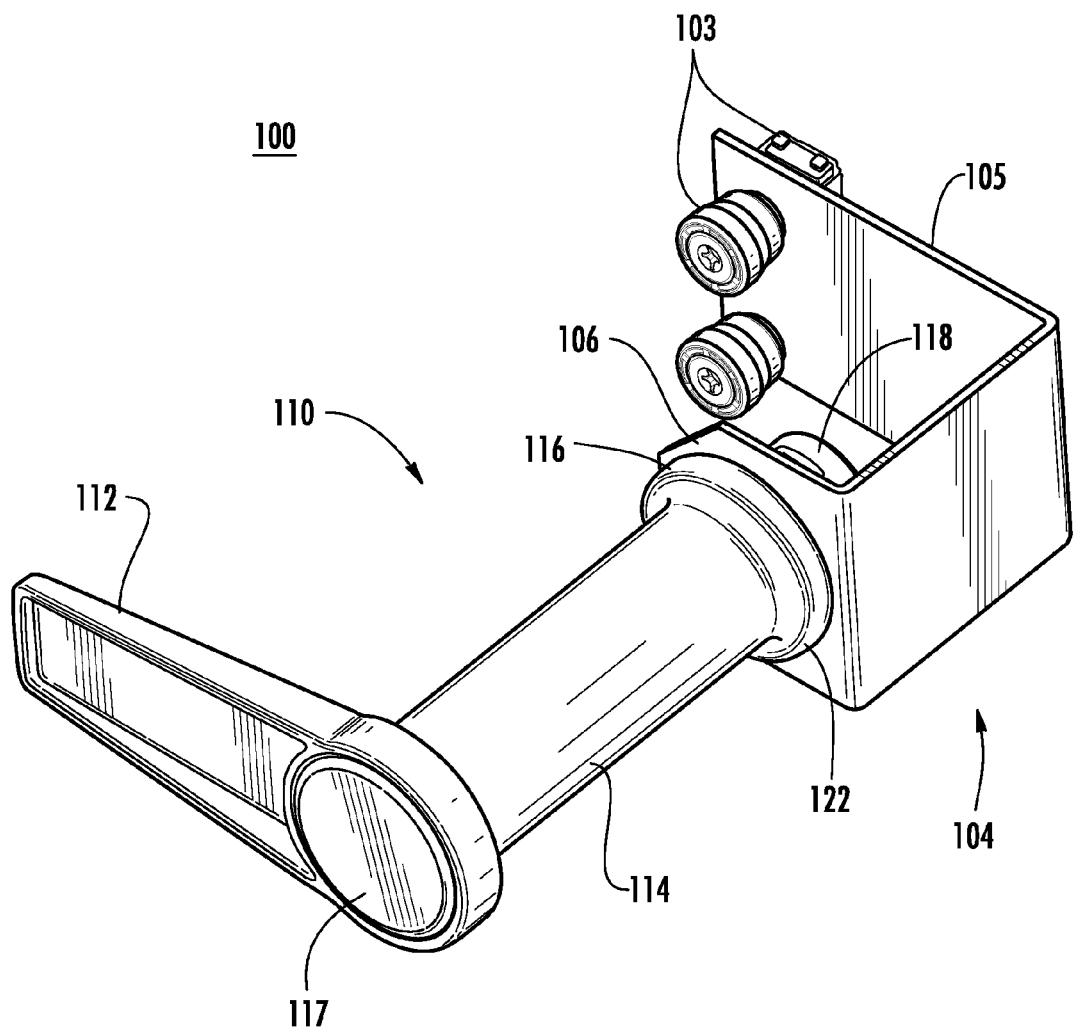
FIG. 3 is an isometric view of one of the handle spool assemblies of FIG. 1, shown in isolation.
Figure 4A:
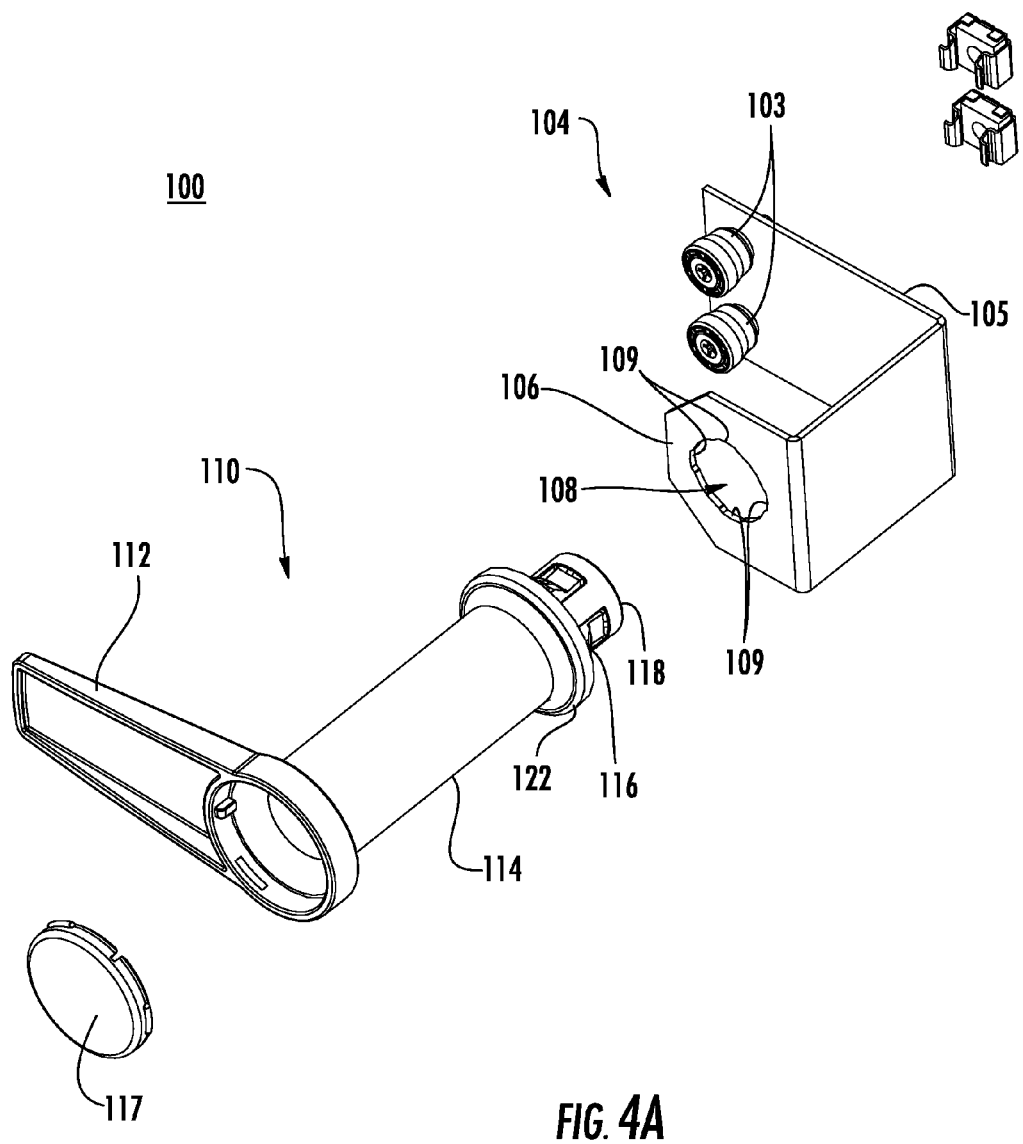
FIGS. 4A and 4B are exploded orthogonal views of the handle spool assembly of FIG. 3.
Figure 4B:
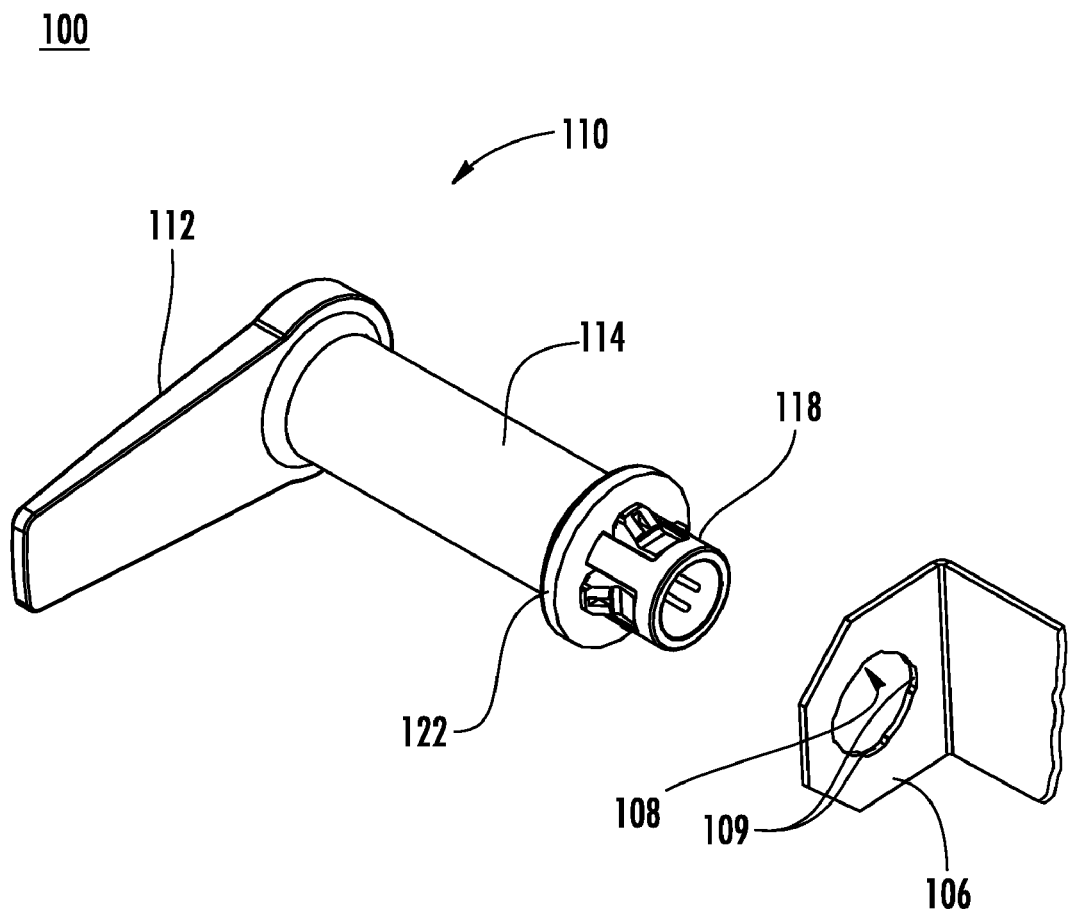

FIGS. 3, 4A and 4B are an isometric view and two exploded orthogonal views, respectively, of one of the handle spool assemblies of FIG. 1, shown in isolation. The handle spool assembly 100 includes a repositionable handle spool 110 coupled to a mounting bracket 104. The handle spool 110 includes a gate arm 112 mounted perpendicularly to a cylindrical shaft 114 that extends from a repositionable base 116. The gate arm 112, shaft 114 and base 116 are preferably integrally formed. Such formation may occur via injection molding or the like. In the illustrated embodiment, at least some portions of the spool 110 are hollow, but alternatively may be semi-hollow or solid, if desired, without departing from the scope of the present invention. A cap 117, which may also be injection molded, may be used to cover the end of the shaft 114. It is preferred that the handle spool 110 is constructed of plastic and that the mounting bracket 104 is constructed of sheet metal.

Figure 5:
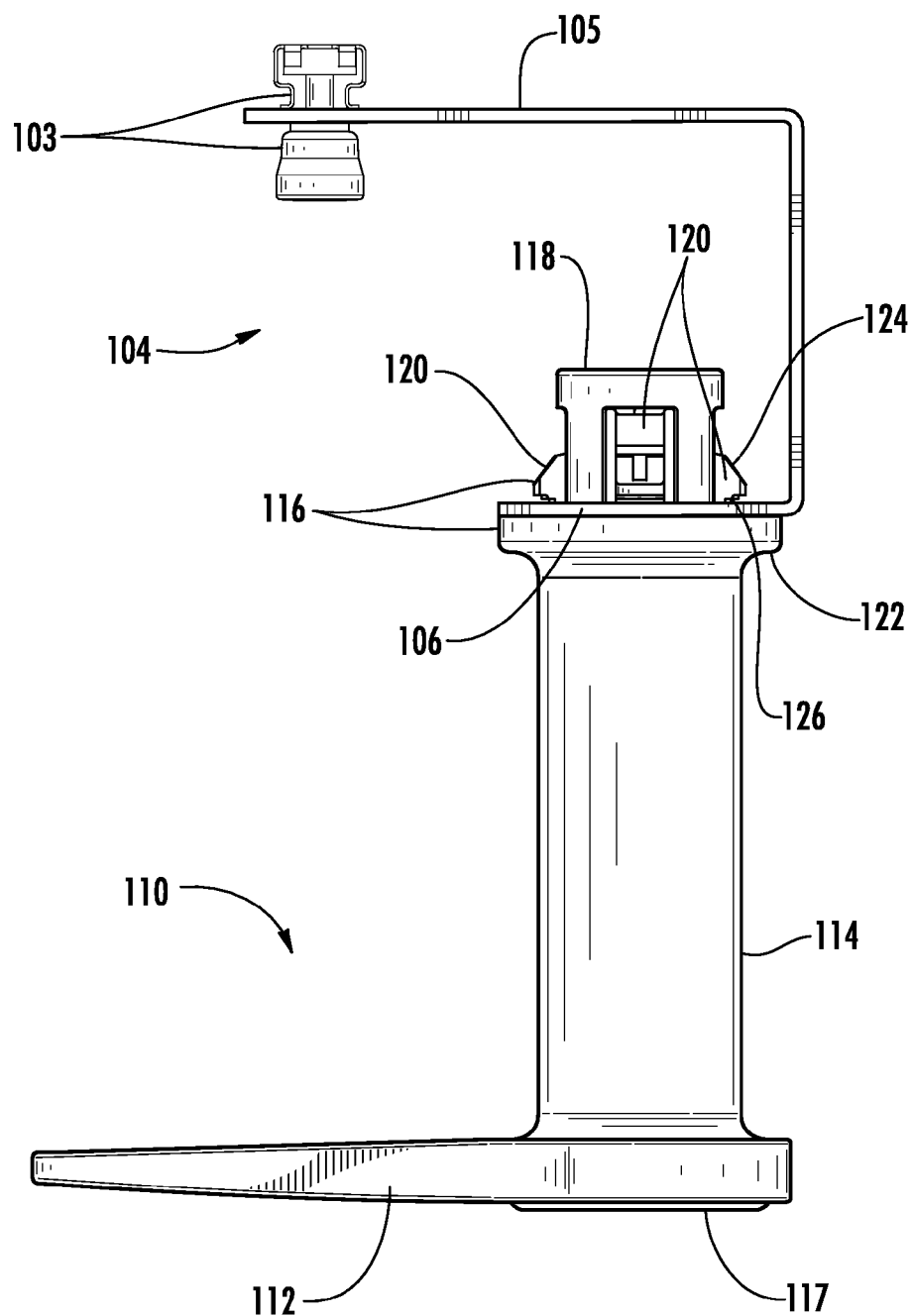
FIG. 5 is a top plan view of the handle spool assembly of FIG. 3.
Figure 6:
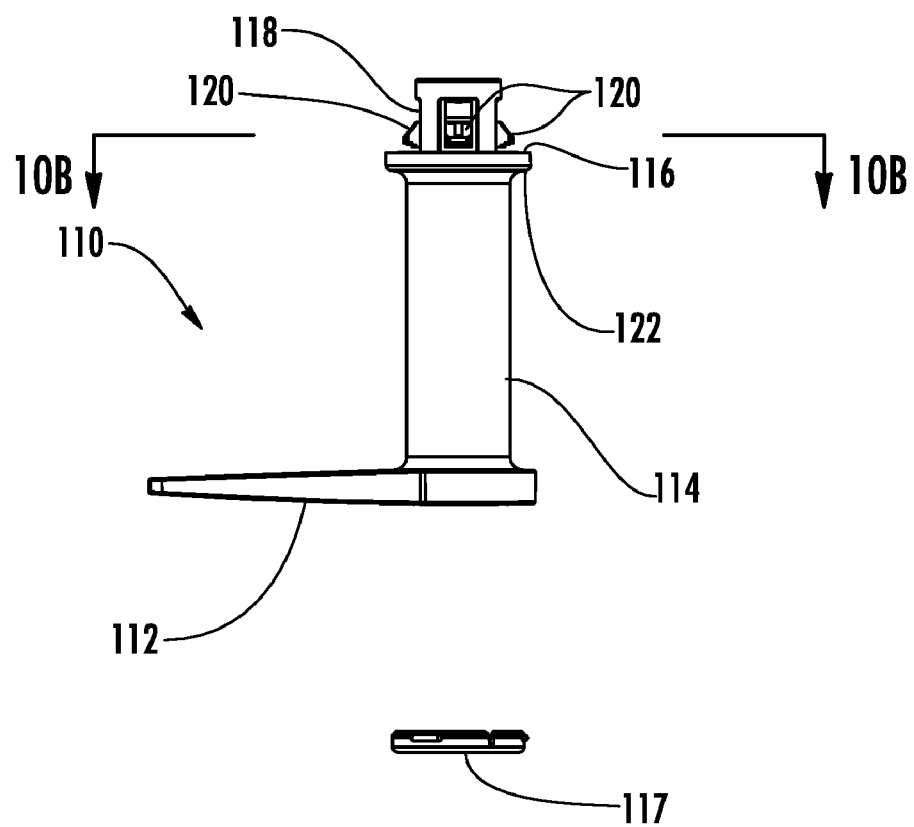
FIG. 6 is an exploded top plan view of the handle spool assembly of FIG. 3.
Figure 7:
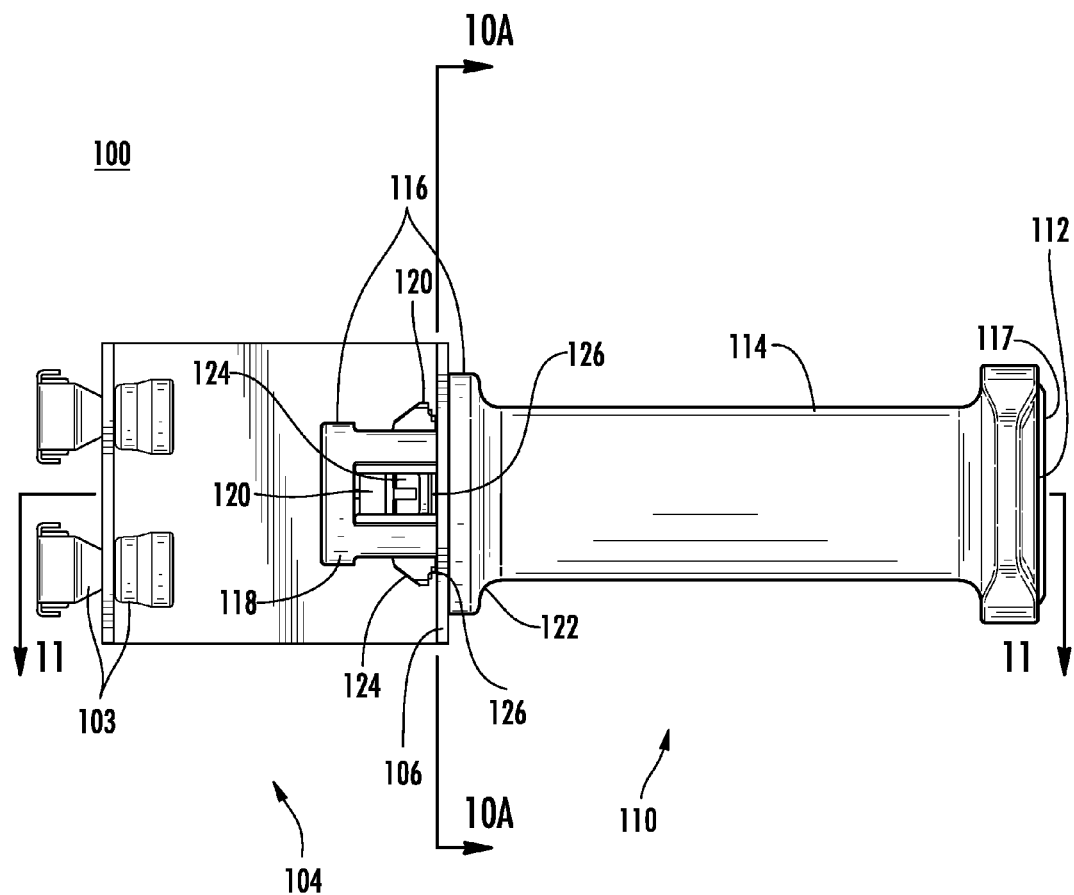
FIG. 7 is a left side plan view of the handle spool assembly of FIG. 3.

FIGS. 5-7 are a top plan view, an exploded top plan view and a left side plan view of the handle spool assembly of FIG. 3. As shown therein, the repositionable base 116 includes a generally cylindrical stub 118, around which are disposed four resilient bosses 120 that may be depressed radially inwardly relative to the stub 118, bearing surfaces that follow the radius of curvature of the stub 118 and disposed between the bosses 120, and a coaxial seating flange 122. The bearing surfaces keep the spool 110 centered in a spool opening 108 of the mounting bracket 104. In the illustrated embodiment, the bosses 120 are arranged evenly and circumferentially around the cylindrical stub 118 at 90 degree intervals, but it will be appreciated that such spacing need not be even, and that other numbers of bosses 120 may be utilized. As perhaps best seen in FIG. 5, each boss 120 is attached to the stub 118 near the end of the stub 118 and extends away from the end of the stub 118 in a hollow or opening defined by the side of the stub 118. Each boss 120 includes a beveled or ramped deflection face 124 and a stepped retention face 126. The deflection face 124 and retention face 126 flex into the opening to provide locating detents when the spool 110 is rotated. In addition, each boss 120 includes a profile that mates or matches profiles of recesses 109 formed in mounting bracket 104. The recesses 109 will be described in greater detail below.

Figure 8:
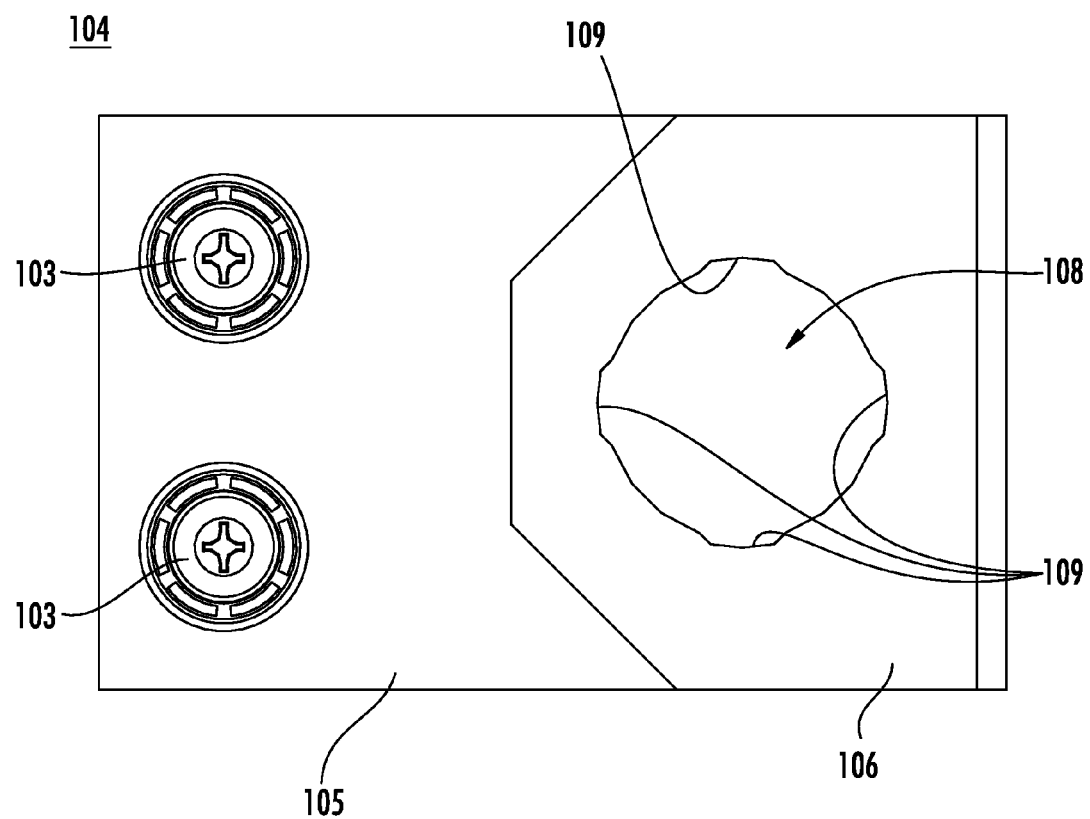
FIG. 8 is a front plan view of the mounting bracket of FIG. 3.
Figure 9:
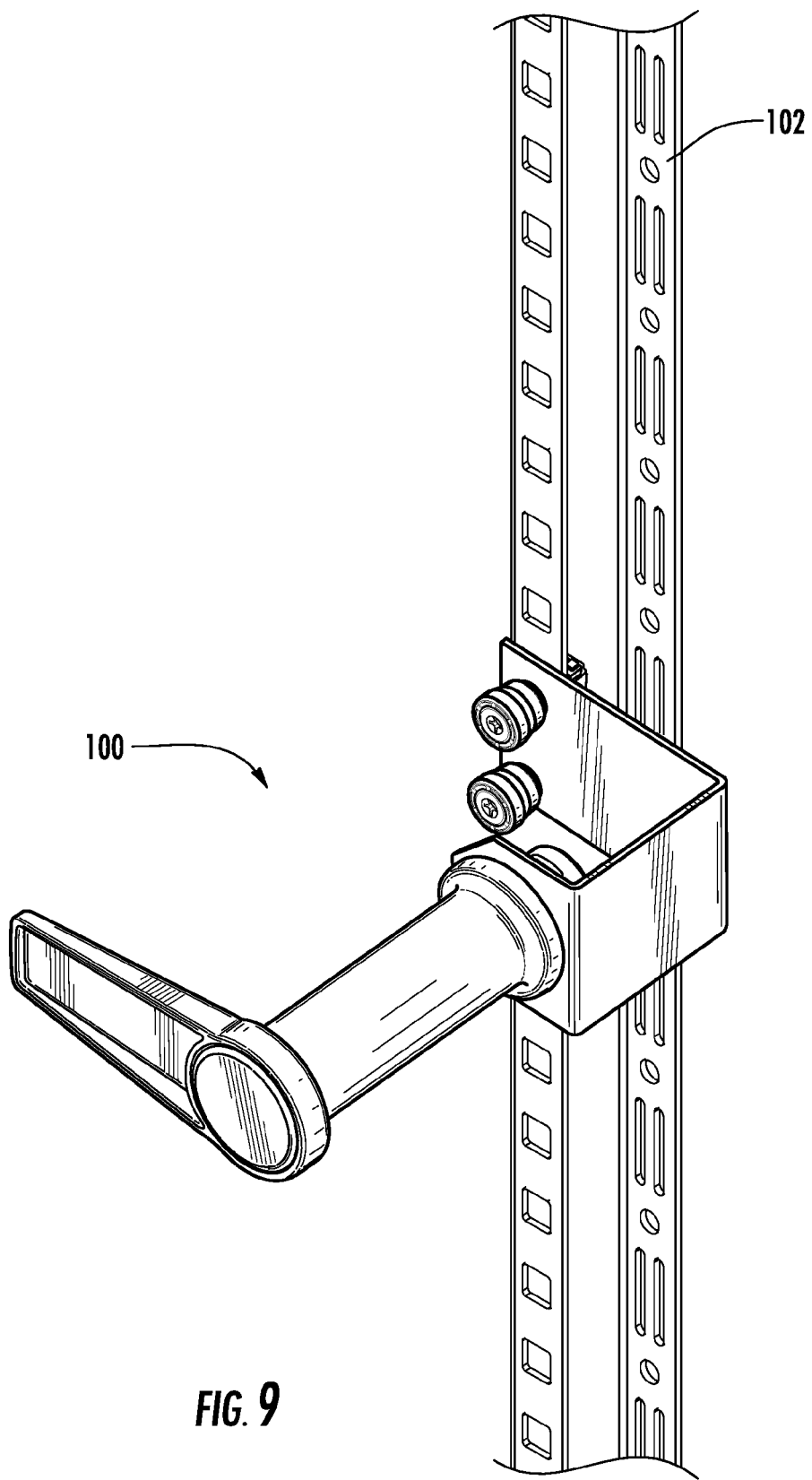
FIG. 9 is a fragmentary isometric view of the mounting bracket of FIG. 3 attached to one of the auxiliary mounting rails of FIG. 1.

FIG. 8 is a front plan view of the mounting bracket 104 of FIG. 3. The mounting bracket 104 includes a primary mounting plate 105 and a handle spool shelf 106. The primary mounting plate 105 is penetrated by a plurality of mounting apertures arranged to align with individual apertures on any desired mounting structure, and may be attached to the structure with fasteners 103 inserted therethrough. Any of a wide variety of mounting structures may be suitable for this purpose. For example, FIG. 9 is a fragmentary isometric view of the mounting bracket 104 of FIG. 3 attached to one of the auxiliary mounting rails 102 of FIG. 1. Notably, in at least one embodiment, the primary mounting plate 105 is longer than the handle spool shelf 106 so that the handle spool 110 can be slightly displaced from the structure to which it is mounted.

Figure 10A:
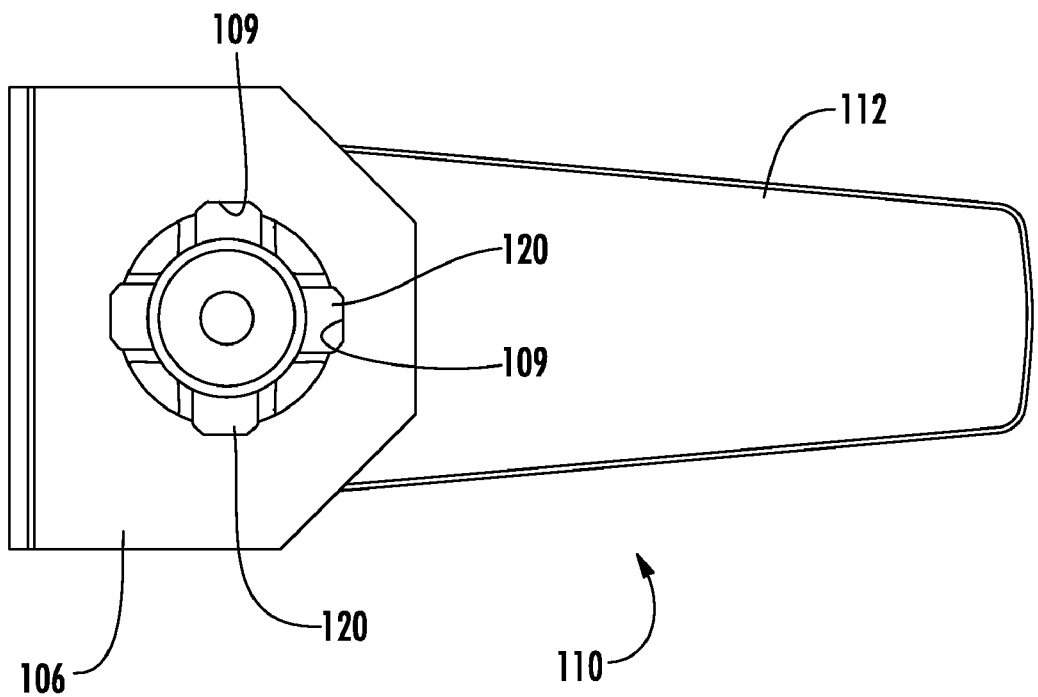
FIG. 10A is a rear cross-sectional view of the handle spool assembly of FIG. 7, taken along line 10A-10A.
Figure 10B:
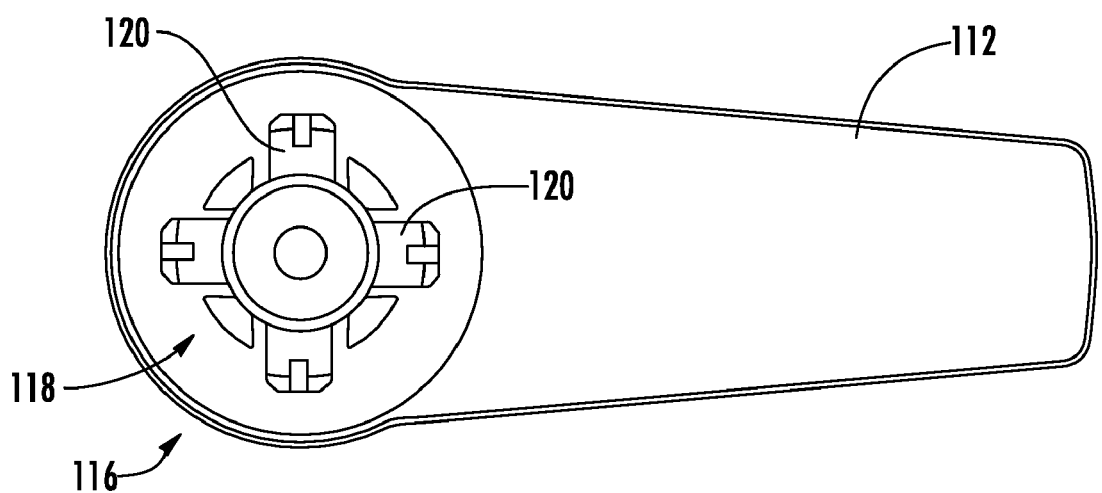
FIG. 10B is a rear cross-sectional view of the handle spool of FIG. 6, taken along line 10B-10B.

FIG. 10A is a rear cross-sectional view of the handle spool assembly 100 of FIG. 7, taken along line 10A-10A, and FIG. 10B is a rear cross-sectional view of the handle spool 110 of FIG. 6, taken along line 10B-10B. Each cross-sectional view is thus taken in the vicinity of the point where the mounting stub 118 intersects the mounting handle spool shelf 106. The shelf 106 includes the spool opening 108 for receiving the mounting stub 118 of the handle spool 110. The opening 108 is generally circular but with a plurality of small recesses 109 arranged around the periphery thereof. The recesses 109 include a profile that matches a profile of a portion of the bosses 120. More specifically, the profile of each recess 109 has three sections, two side sections and a center section. The center section may be generally linear and slightly rounded at the ends, while the side sections are generally linear and gently slope to connect the central section of the recess 109 to the main portion of the opening 108. The matching profiles of the bosses 120 and the recesses 109 enable the bosses 120 to fit snugly into the recesses 109 when the spool is assembled. The sloping of the recess side sections enables the spool 110 to be turned by pulling the gate arm 112, i.e., the gently sloping side sections depresses the boss 120 into the stub opening so that the spool 110 can be turned. In the illustrated embodiment, the recesses 109 are arranged evenly around the opening 108 at 90 degree intervals, but it will be appreciated that such spacing need not be even, and that other numbers of recesses 109 may be utilized, so long as correspondence to the bosses 120 on the handle spool stub 118 is maintained. It will be appreciated, however, that a greater number of recesses 109 than bosses 120 may be provided, so long as there is at least one and preferably a plurality of different dispositions in which the stub 118 may be mounted in the openings 108.

Figure 11:
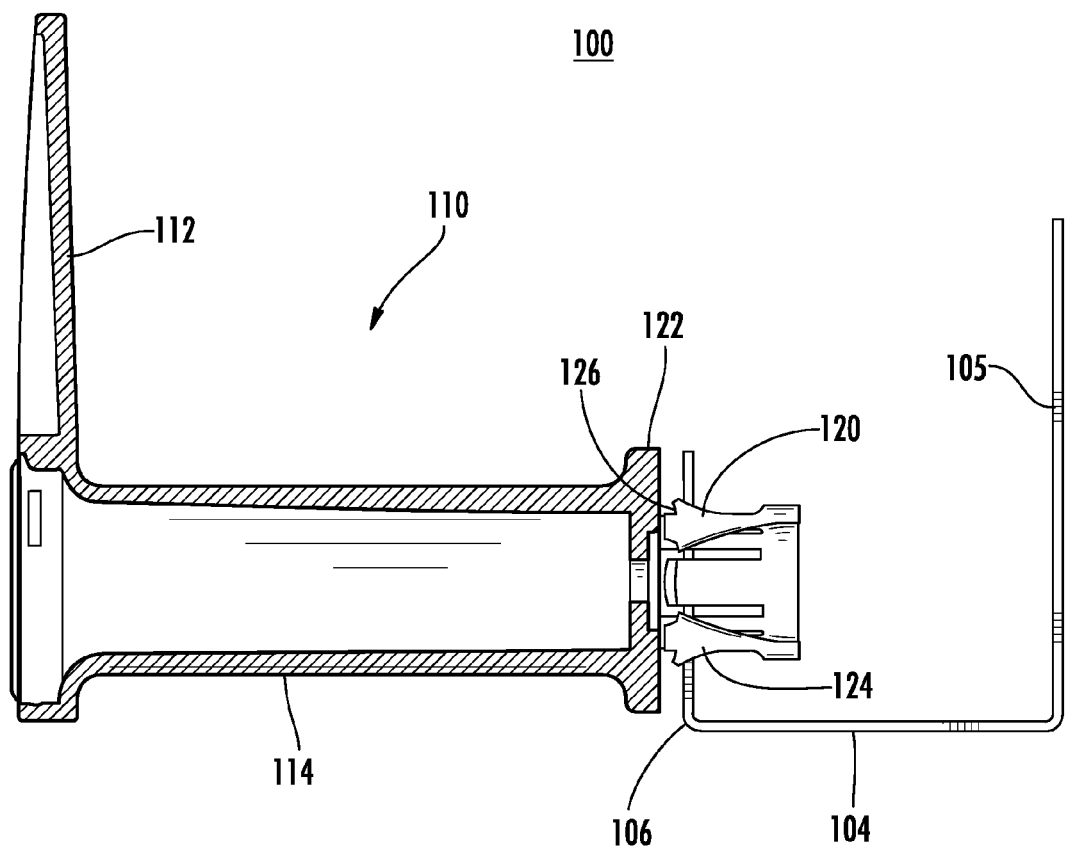
FIG. 11 is a top cross-sectional view of the handle spool assembly of FIG. 7, illustrating the stub being inserted into the opening of the mounting bracket.

FIG. 11 is a top cross-sectional view of the handle spool assembly 100 of FIG. 7, illustrating the stub 118 being inserted into the opening 108 of the mounting bracket 104. To insert the stub 118 into the opening 108, the bosses 120 on the stub 118 must be aligned with the recesses 109 around the periphery of the opening 108. Because the bosses 120 and recesses 109 are each arranged at 90 degree intervals, this may be accomplished with the handle spool 110 in any of four rotational orientations. More particularly, the gate arm 112 may be rotated for disposition at any of four different orientations, with such orientations being at 90 degree intervals relative to each other. Preferably, the four orientations include the gate arm 112 being disposed horizontally to the left (when viewed from the front, as shown in FIG. 1), vertically upward, horizontally to the right, and vertically downward.

The depth of each recess 109 relative to the edge of the opening 108 corresponds to the extent of the boss 120 from the side of the stub 118 in an undepressed state. More particularly, the depth of the recess 109 is designed such that as the stub 118 is pushed through the opening 108, the rim of each recess 109 bears against the beveled deflection face 124 on one of the bosses 120, deflecting it radially inward, until the widest portion is passed and the stepped retention face 126 is reached. Because the stepped retention face 126 is narrower than the widest portion of the bosses 120, each boss 120 then "snaps" into place and is held in place by an appropriate step or ledge (visible in FIG. 5) on the retention face 126.

In use, wires, optical fiber and other cables (not shown) are routed along or around the spool 110, or if more than one spool 110 is used, as shown in FIG. 1, cables are routed along or around one or more of the spools 110. Each spool shaft 114 provides a radius of curvature that corresponds to one or more standards, such as for fiber cables. In addition, each gate arm 112 prevents cables from moving forward, a feature perhaps best understood with reference to FIG. 2. As noted previously, the handle spool 110 may be installed in any one of four orientations through selection of which bosses 120 are installed in which recesses 109. Conveniently, once the handle spool 110 is installed, it may be rotated by simply grasping the gate arm 112 and exerting a relatively minimal pressure in the direction in which it is desired to move the gate arm 112. The side sections of the recesses 109 gently depress the bosses 120 of the handle spool 110 into the openings thereof thereby enabling the indexing feature of the handle spool 110. As the spool rotates, the bosses 120 flex into and out of the recesses 109 to provide a rotational detent feel.

The handle spool 110 may be removed by reaching between the primary mounting plate 105 and the handle spool shelf 106 and squeezing the bosses 120 inward enough to permit removal of the stub 118 entirely by reversing the insertion process described previously. The bosses 120 may be squeezed by a user's fingers or via a tool. Although the handle spool 110 may be removed according to the method described, a feature of the handle spool is that it is relatively difficult for the handle spool 110 to be inadvertently pulled from the mounting bracket 104 thereof such as by a tangled cable or wire or another snagging feature. In fact, the handle spool 110 has been designed such that the plastic material of which the handle spool 110 is composed will fail before the handle spool 110 is pulled out of the mounting bracket 104. Such feature ensures that a handle spool 110 is not inadvertently pulled out of a mounting bracket 104 while it is in service.

Advantageously, the operation of the repositionable handle spools 110 permits cables to be installed along a plurality of handle spool assemblies 100 aligned vertically and held in place by the gate arms 112 of the respective handle spools 110 mounted thereon. In conjunction with the cylindrical shafts 114 of the spools 110, this provides for retention of such cables along at least three boundaries, defined by the primary mounting plates 105 of the assemblies 100 and any member or members to which they are attached or adjacent, the cylindrical shafts 114, and the gate arms 112. Furthermore, if the handle spool assemblies 100 are mounted adjacent a wall of cable guides 144,145, as may be seen in FIG. 2, then a closed channel may be defined with boundaries on all four sides. Cables may be loaded into a three- or four-sided channel by removal or rotation of the handle spools 110 such that the gate arms 112 do not block the front entrance to the channel and then insertion or rotation of the spools 110 to close that entrance and retain the cables in the channel. Of course, cables may be routed around any of the cylindrical shafts 114, thereby leaving the channel, if desired, with the radius of curvature of the shafts 114 ensuring that a minimum turn radius is maintained with regard to each such cable.

Figure 12:
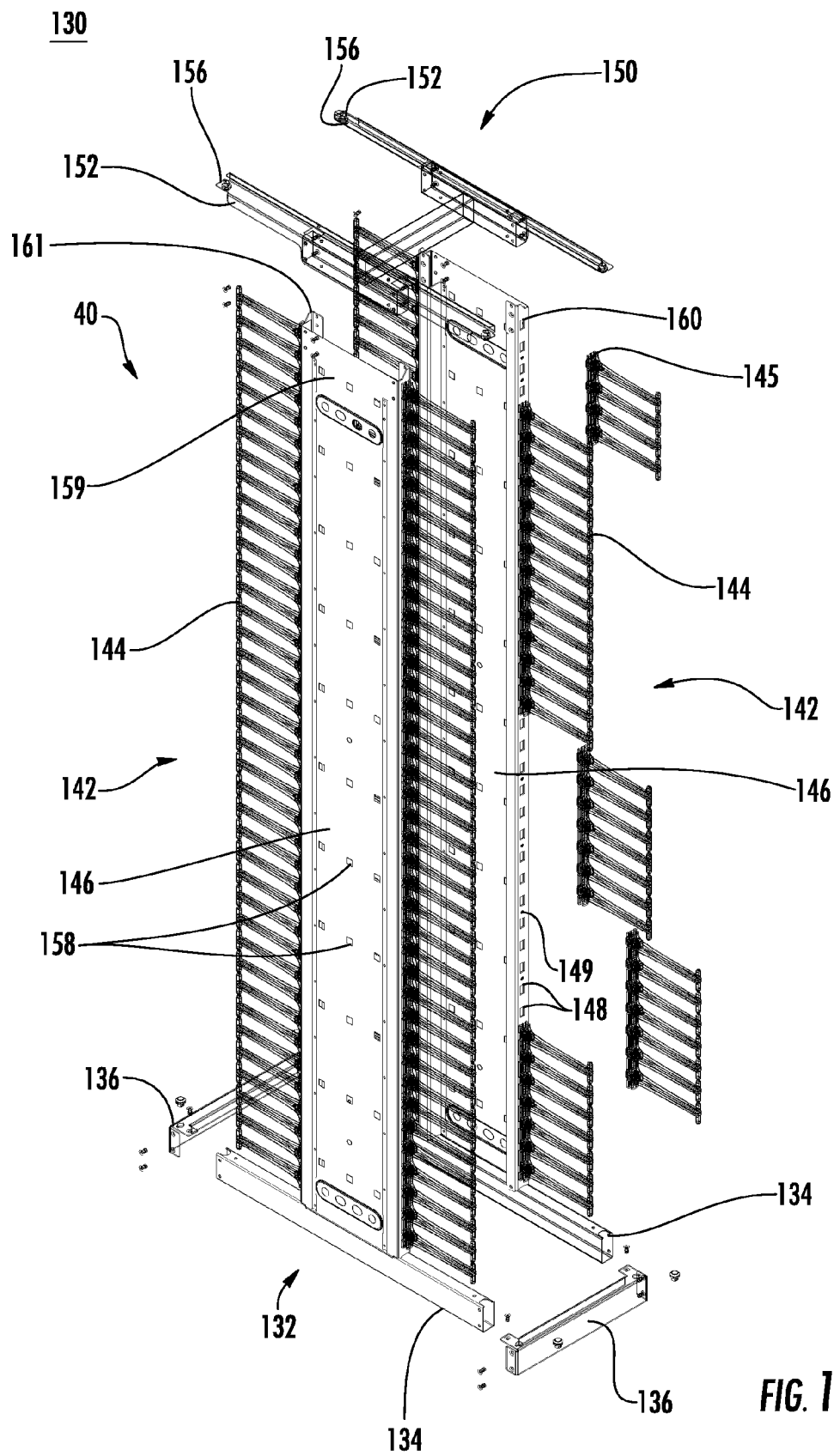
FIG. 12 is an isometric view of a vertical cable manager including several repositionable shelf-mounted handle spool assemblies, for cable routing, in accordance with a second preferred embodiment of the present invention.
Figure 13:
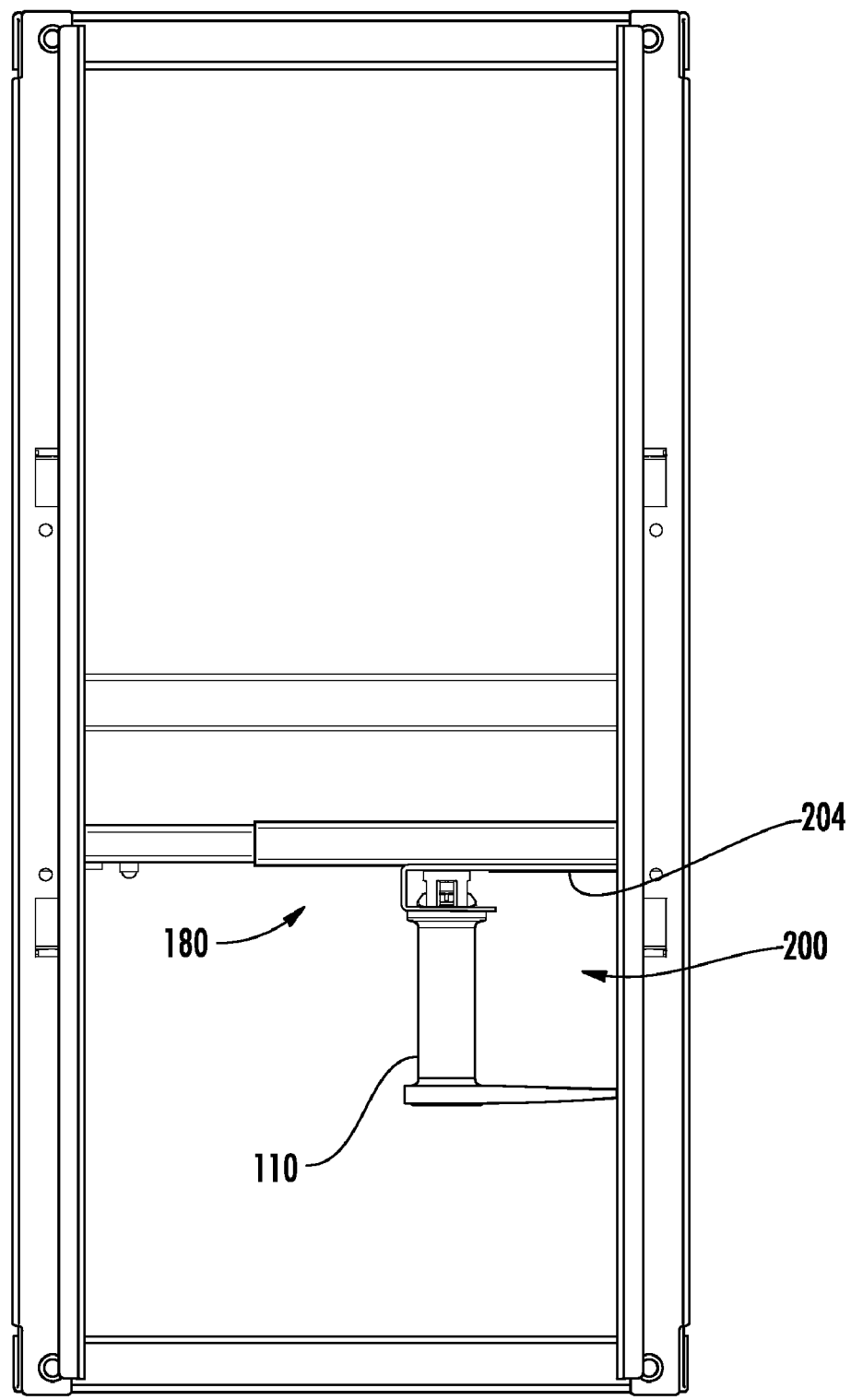
FIG. 13 is a top view of the vertical cable manager of FIG. 12.

FIG. 12 is an exploded isometric view of a vertical cable manager 130 for cable routing, and FIG. 13 is a top view of the vertical cable manager 130 of FIG. 12, shown with two repositionable shelf-mounted handle spool assemblies 200 mounted therein, in accordance with a second preferred embodiment of the present invention. The vertical cable manager 130 includes a base 132, an interconnected double-spine assembly 140 topped by a top frame 150, and a pair of doors (not shown). The double-spine assembly 140 is supported by the base 132, thus avoiding the necessity of supporting the apparatus 130 on an adjoining mounting fixture (not shown). Each door is removably coupled at each lower corner to the base 132 and at each upper corner to the top frame 150, thus permitting each door to be opened or hinged along either of its lateral sides or removed entirely. The base 132 comprises a frame that includes two side members 134 and two cross members 136, with the length of the side members 134 and the length of the cross members 136 defining the depth and width, respectively, of the vertical cable manager 130.

The interconnected double-spine assembly 140 includes two spine assemblies 142, each having a plurality of ribbed or fingered cable guides 144,145 extending forwardly and a plurality of ribbed or fingered cable guides 144,145 extending rearwardly from a vertical support column 146. The spine assemblies 142 are interconnected at their lower ends by the base 132 and at their upper ends by the top frame 150. Each support column 146 may be formed from a C-shaped section of metal, producing a lateral portion 159, a front portion 160 and a rear portion 161. Penetrating each of the front and rear portions 160,161 are a series of preferably evenly-spaced square apertures 148 and a number of small round apertures 149 interspersed therebetween. The fingered cable guides 144,145 are attached to the front and rear portions 160,161 of the support columns 146 via the apertures 148,149 therein.

The top frame 150 includes two side assemblies 152 and a cross member 154. Each side assembly 152 includes a portion for mounting to the top of a respective support column 146 and a horizontal rail. A hinge/latch interface 156 is disposed at each of the distal ends of the horizontal rails, thereby providing hinge and latch functions for each lateral side of each door. The cross member 154 stabilizes the upper ends of the spine assemblies 142, fixing the distance therebetween. Optionally, additional interconnection between the spine assemblies 142 may be provided by midsection members 180, shown in FIG. 13, attached to the support columns 146 via square apertures 158 therein. A variety of accessories may be mounted to the midsection members 180 to aid in the routing of cables (not shown) therethrough and to better retain the cables therein.

Figure 14:
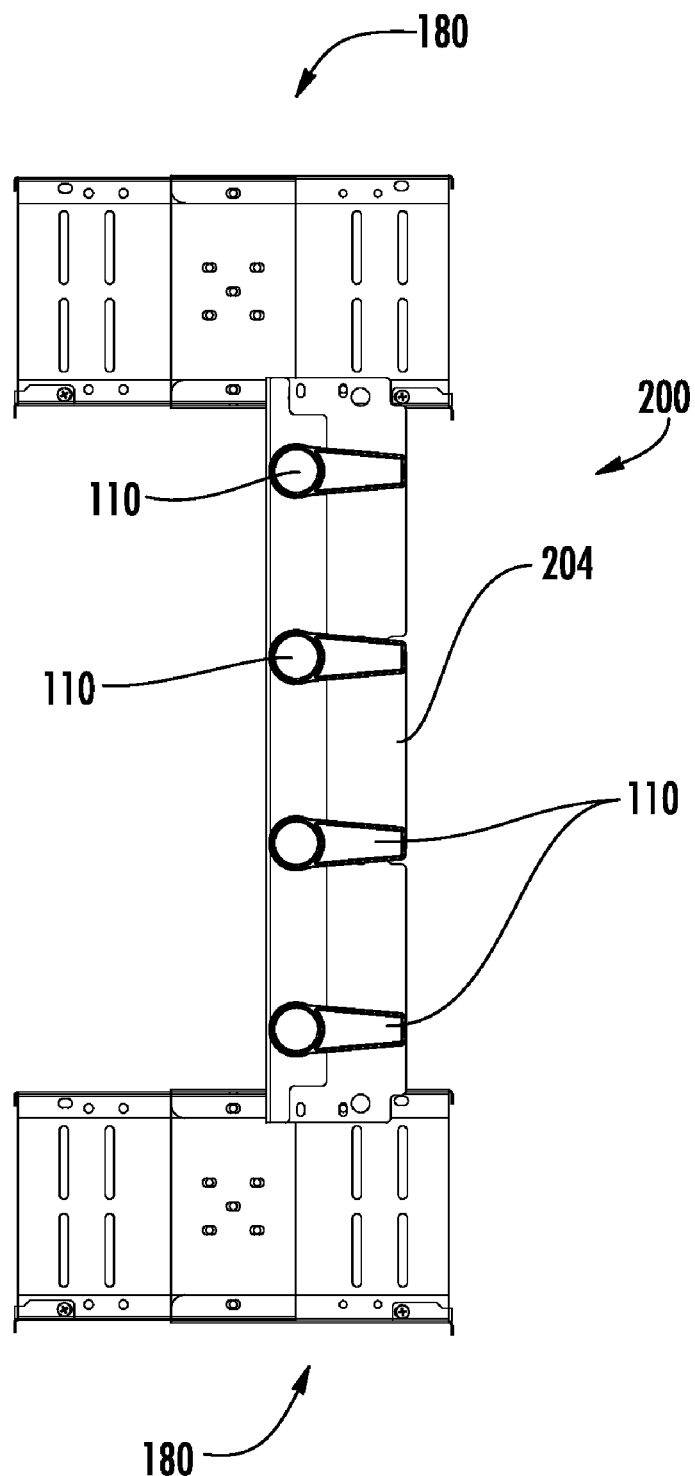
FIG. 14 is a front view of one of the handle spool assemblies and two of the midsection members of FIG. 12.
Figure 15:
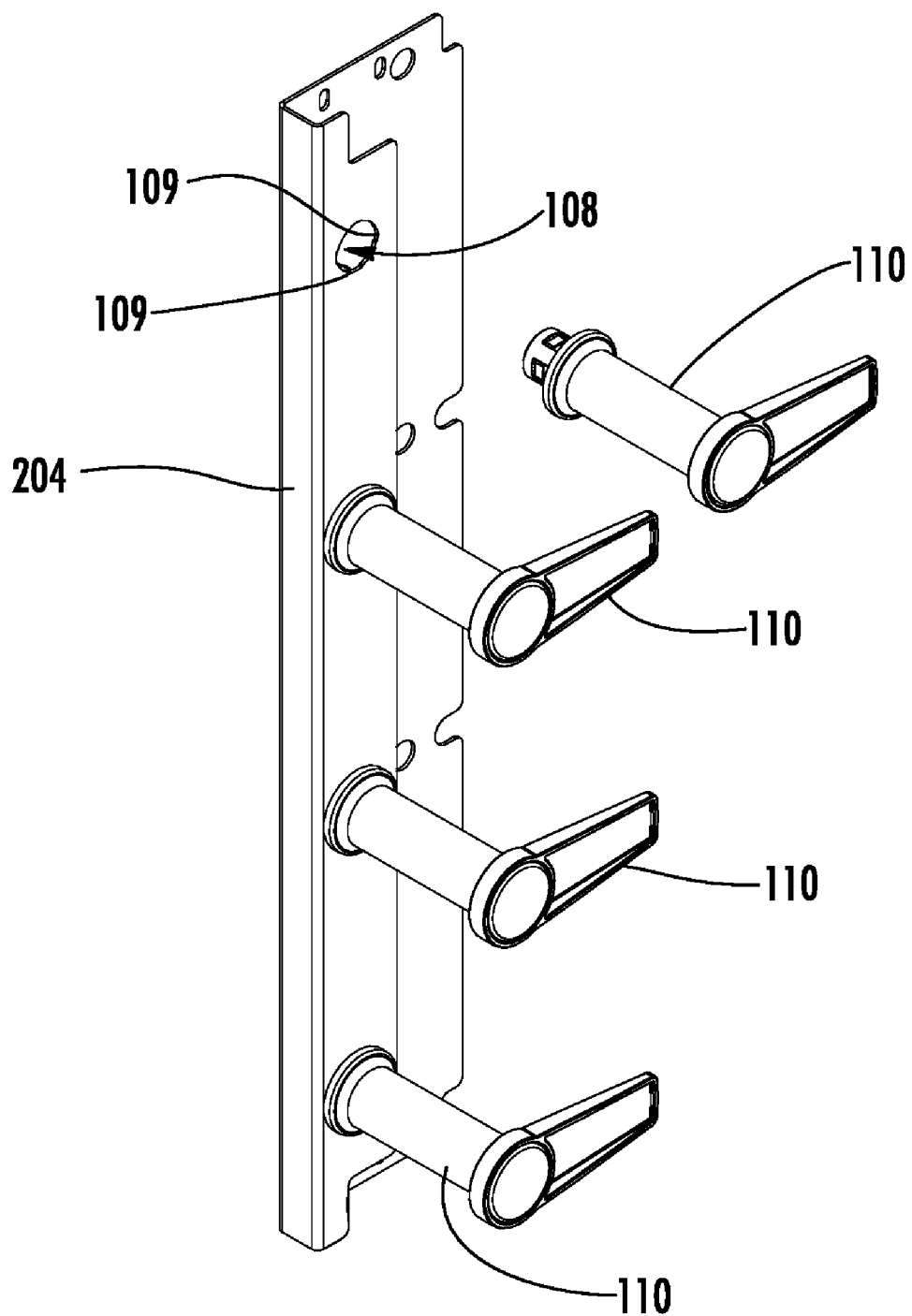
FIG. 15 is a partially exploded isometric view of the handle spool assembly of FIG. 14.
Figure 16:
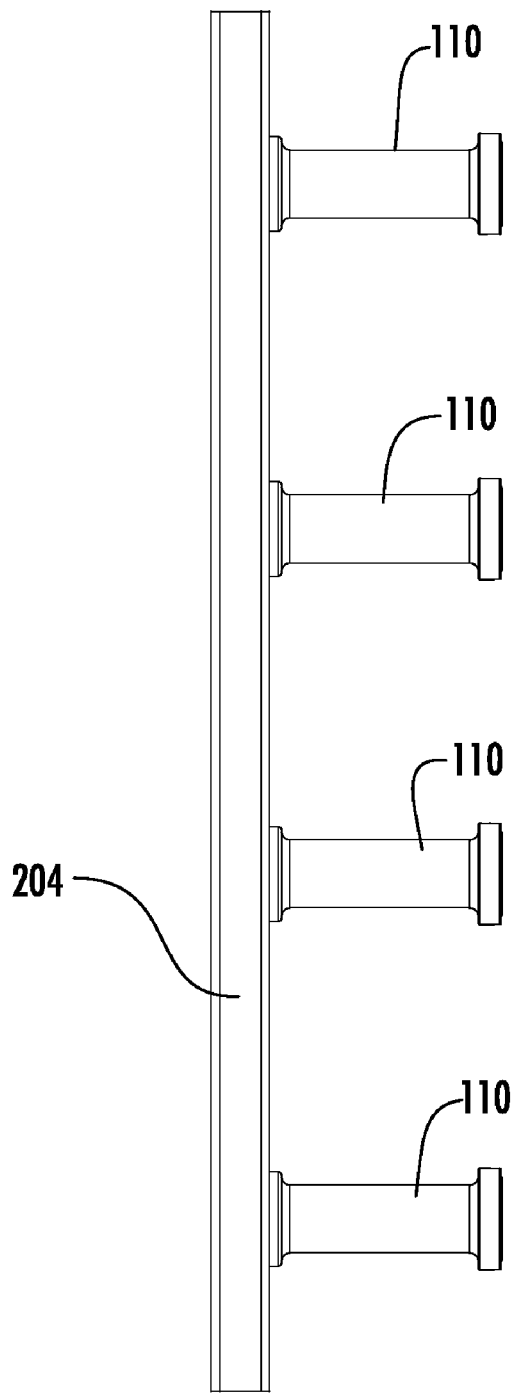
FIG. 16 is a left side view of the handle spool assembly of FIG. 14.
Figure 17:
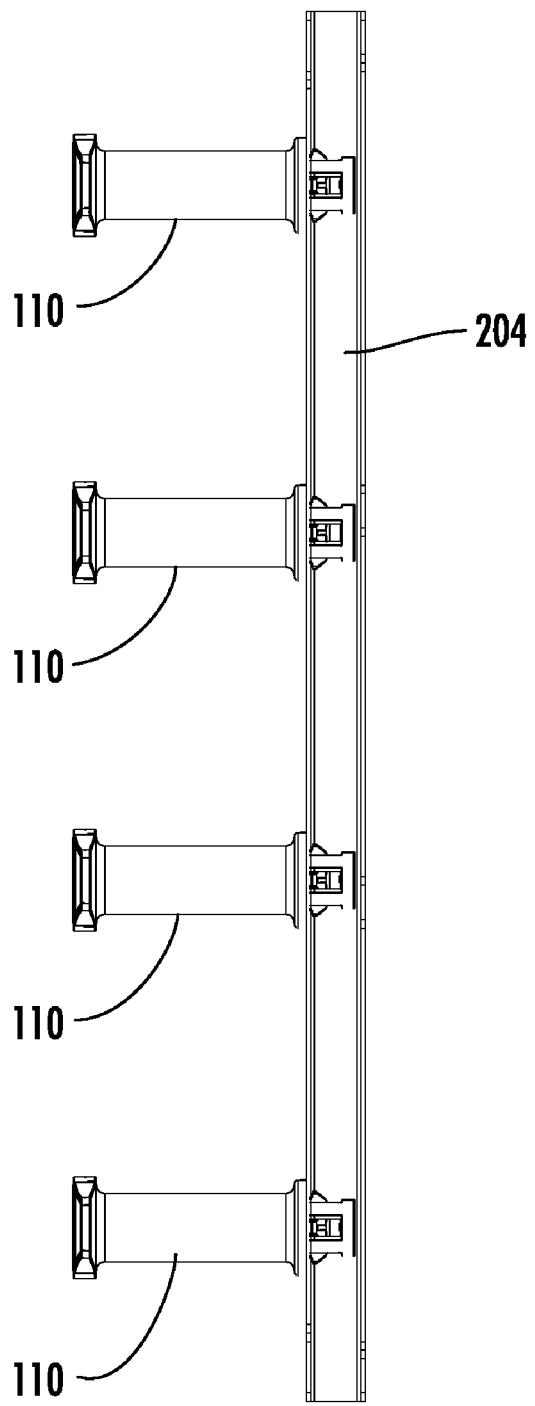
FIG. 17 is a right side view of the handle spool assembly of FIG. 14.
Figure 18:
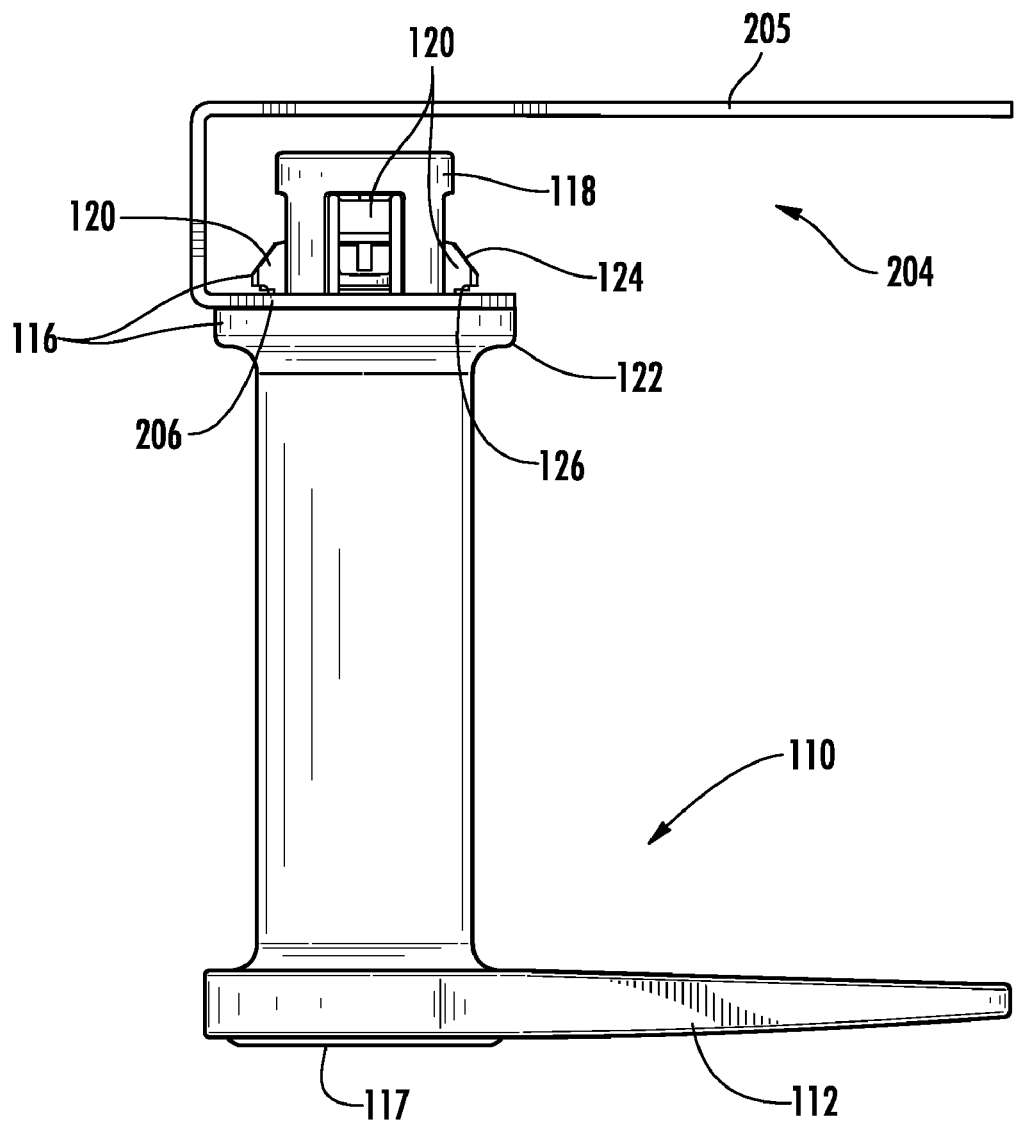
FIG. 18 is a top view of the handle spool assembly of FIG. 14.

FIG. 14 is a front view of one of the handle spool assemblies 200 and two of the midsection members 180 of FIG. 13, and FIGS. 15-18 are a partially exploded isometric view, a left side view, a right side view and a top view, respectively, of one of the repositionable shelf-mounted handle spool assemblies 200 and two of the midsection members 180 of FIG. 13. The handle spool assembly 200 includes one or more repositionable handle spools 110, of the type illustrated in FIGS. 1-7 and described in the accompanying text, mounted on, and aligned along, a back plate 204. In the embodiment shown, there are four repositionable handle spools 110, but it will be appreciated that greater or fewer numbers of spools 110 may likewise be used. Further, in at least some embodiments, the spools 110 are arranged horizontally instead of vertically; and in at least some embodiments, the spools 110 are arranged in more than one column or row.

Figure 19:
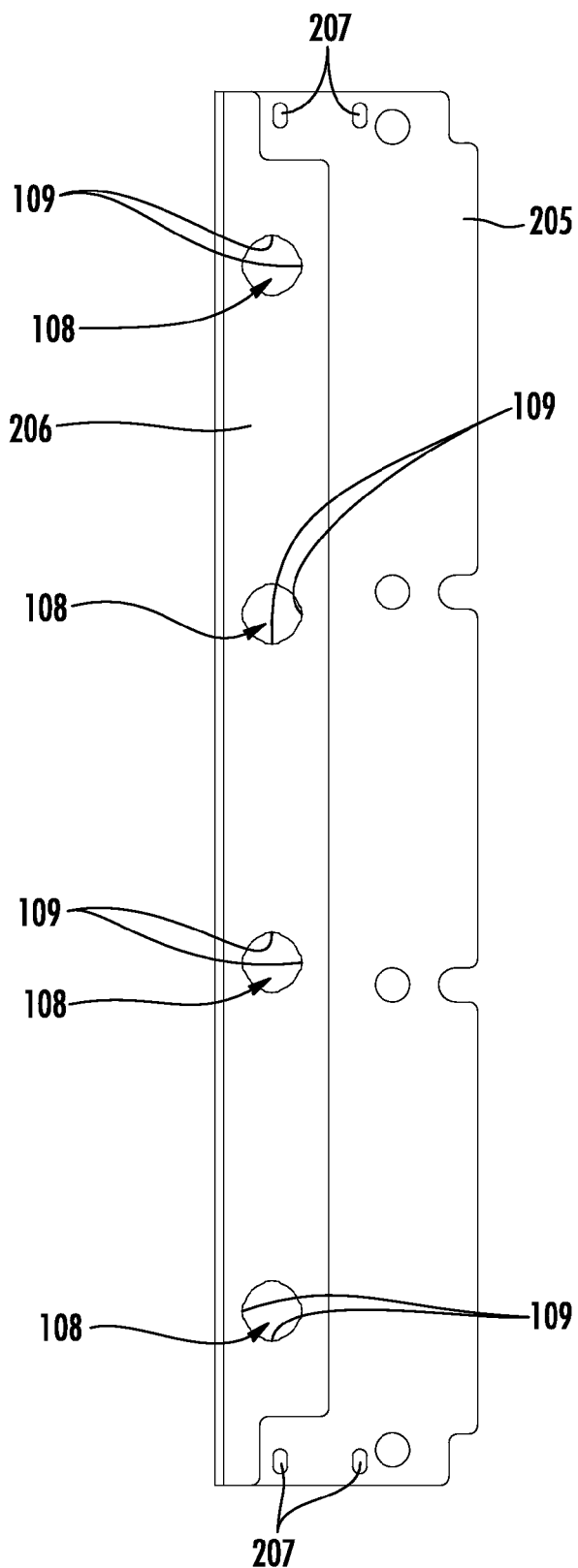
FIG. 19 is a front plan view of the back plate of FIG. 14.

FIG. 19 is a front plan view of the back plate 204 of FIG. 14. The back plate 204 of the handle spool assembly 200 includes a primary mounting plate 205 and a handle spool shelf 206. The primary mounting plate 205 is penetrated by a plurality of mounting apertures 207 arranged to align with individual apertures 201 on the midsection members 180, and may be attached to the midsection members 180 with fasteners (not shown) inserted therethrough. The primary mounting plate 205 is further penetrated by a plurality of access openings and cutaways to provide access to other fasteners and mounting apertures on various midsection members 180 mounted therebehind if necessary.

The shelf 206 includes a plurality of spool openings 108 for receiving the mounting stubs 118 of the respective handle spools 110. In the illustrated embodiment, there are four spool openings 108 in each handle spool assembly 200, corresponding to the four handle spools 110 mounted thereon, but it will be appreciated that greater or fewer numbers of openings 108 may be provided, and that not all of the openings 108 necessarily need to be occupied. Each opening 108 is generally circular but with a plurality of small recesses 109 arranged around the periphery thereof. The recesses 109 include a profile that matches a profile of a portion of the bosses 120. More specifically, the profile of each recess 109 has three sections, two side sections and a center section. The center section is generally linear and is slightly rounded at its ends, while the side sections are generally linear and gently slope to connect the central section of the recess 109 to the main portion of the opening 108. The matching profiles of the bosses 120 and the recesses 109 enables the bosses 120 to fit snugly into the recesses 109 when the spool is assembled. The sloping of the recess side sections enables the spool 110 to be turned by pulling the gate arm 112, i.e., the gently sloping side sections depress the boss 120 into the stub opening 108 so that the spool 110 can be turned. In the illustrated embodiment, the recesses 109 are arranged evenly around each opening 108 at 90 degree intervals, but it will be appreciated that such spacing need not be even, and that other numbers of recesses 109 may be utilized, so long as correspondence to the bosses 120 on the handle spool stubs 118 is maintained. It will be appreciated, however, that a greater number of recesses 109 than bosses 120 may be provided, so long as there is at least one and preferably a plurality of different dispositions in which the stubs 118 may be mounted in the openings 108.

To insert a stub 118 into an opening 108, the bosses 120 on the stub 118 must be aligned with the recesses 109 around the periphery of the opening 108. Because the bosses 120 and recesses 109 are each arranged at 90 degree intervals, this may be accomplished with the handle spool 110 in any of four rotational orientations. More particularly, the gate arm 112 may be rotated for disposition at any of four different orientations, with such orientations being at 90 degree intervals relative to each other. Preferably, the four orientations include the gate arm 112 being disposed horizontally to the right (when viewed from the front, as shown in FIG. 14), vertically upward, horizontally to the left, and vertically downward.

The depth of each recess 109 relative to the edge of its respective opening 108 corresponds to the extent of each boss 120 from the side of its respective stub 118. More particularly, the depth of the recess 109 is chosen such that as the stub 118 is pushed through the opening 108, the rim of each recess 109 bears against the beveled deflection face 124 on one of the bosses 120, deflecting it radially inward, until the widest portion is passed and the stepped retention face 126 is reached. Because the stepped retention face 126 is narrower than the widest portion of the bosses 120, each boss 120 then "snaps" into place and is held in place by an appropriate step or ledge (visible in FIG. 18) on the retention face 126.

In use, wires, optical fiber and other cables (not shown) are routed along or around one or more of the spools 110. Each spool shaft 114 provides a radius of curvature that corresponds to one or more standards, such as for fiber cables. In addition, each gate arm 112 prevents cables from moving forward, away from the midsection member 180, a feature perhaps best understood with reference to FIG. 13. As noted previously, each handle spool 110 may be installed in any one of four orientations through selection of which bosses 120 are installed in which recesses 109. Conveniently, once the handle spool 110 is installed, it may be rotated by simply grasping the gate arm and exerting a relatively minimal pressure in the direction in which it is desired to move the gate arm. The side sections of the recesses 109 gently depress the bosses 120 of the handle spool 110 into the openings thereof thereby enabling the indexing feature of the handle spool 110. The handle spool may be removed by reaching between the primary mounting plate 105 and the handle spool shelf 106 and squeezing the bosses 120 inward enough to permit removal of the stub 118 entirely by reversing the insertion process described previously. The bosses 120 may be squeezed by a user's fingers or via a tool. Although the handle spool 110 may be removed according to the method described, a feature of the handle spool is that it is relatively difficult for the handle spool to be inadvertently pulled from the mounting bracket 104 thereof such as by a tangled cable or wire or another snagging feature. In fact, the handle spool 110 has been designed such that the plastic material of which the handle spool 110 is composed will fail before the handle spool 110 is pulled out of the mounting bracket 104. Such feature ensures that a handle spool 110 is not inadvertently pulled out of a mounting bracket 104 while it is in service.

Advantageously, the operation of the repositionable handle spools permits cables to be installed along the length of the handle spool assembly 200 and held in place by the gate arms 112 of the respective handle spools 110 mounted thereon. In conjunction with the cylindrical shafts 114 of the spools 110, this provides for retention of such cables along at least three boundaries, defined by the primary mounting plate 205, the cylindrical shafts 114, and the gate arms 112. Furthermore, if the unit 200 is mounted adjacent a wall of cable guides 144, 145, as may be seen in FIG. 13, then a closed channel is defined with boundaries on all four sides. Cables may be loaded into a three- or four-sided channel by removal or rotation of the handle spools 110 such that the gate arms 112 do not block the front entrance to the channel and then insertion or rotation of the spools 110 to close that entrance and retain the cables in the channel. Of course, cables may be routed around any of the cylindrical shafts 114, thereby leaving the channel, if desired, with the radius of curvature of the shafts 114 ensuring that a minimum turn radius is maintained with regard to each such cable.

Notably, the length of each gate arm 112 may be chosen to assist in retaining the cables as described. In at least one embodiment, the length of the gate arms 112 is selected to match the width of the primary mounting plate 205 as illustrated in FIG. 14, thereby permitting the distal ends of the gate arms 112 to be disposed immediately adjacent the cable guides 144,145 or other structure disposed along the lateral edge of the cable manager 130. In at least one other embodiment, the length of the gate arms 112 is selected to be less than the width of the primary mounting plate 205 so that a gap remains between the distal ends of the gate arms 112 and the adjacent cable guides 144,145 or other structure. In at least some embodiments, the unit 200 is mounted as close to the adjacent cable guides 144,145 or other structure, while in other embodiments the unit 200 is spaced apart from the adjacent cable guides 144,145 or other structure.

The handle spool assembly supports and controls cables. It allows cables to be supported by a spool which incorporates an arm that may be positioned in discrete, pre-defined locations. The arm may be rotated to allow slack loops to be easily wound or unwound during maintenance. Rotating the arms in an opposed configuration aids in securing cables with a minimum number of components.

The handle spool assembly provides a minimum part count solution for a cable spool system. It provides simplified, tool-less push-in installation. The reverse boss design maximizes load capacity of spool. Previously, bosses positioned in the opposite configuration have had a tendency to release as a load is applied. Further, the bosses and mounting opening provide detent to maintain rotational position in predefined orientations.

Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention. Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof. Although specific terms are employed herein, they are used in a generic and descriptive sense only and not for the purpose of limitation.

What is claimed is:

1. A repositionable shelf-mounted handle spool assembly for cable routing, comprising:
   a. a mounting bracket; and
   b. a repositionable spool, coupled to the mounting bracket, including:
      (i) a base,
      (ii) a cylindrical shaft extending from the base, and
      (iii) a spool head mounted to the cylindrical shaft in a fixed position;
   c. wherein the mounting bracket includes a spool opening that receives the base, the spool opening including a plurality of recesses arranged around the periphery thereof;
   d. wherein the base includes a cylindrical stub at an end thereof, the cylindrical stub including a plurality of resilient bosses arranged circumferentially to correspond with the recesses of the spool opening, each boss being depressable radially inwardly relative to the cylindrical stub for snap-fitting the repositionable spool to the mounting bracket; and
   e. wherein the base may be repositioned relative to the mounting bracket.

2. The repositionable shelf-mounted handle spool assembly of claim 1, wherein the handle spool assembly is configured for use in an electronic equipment enclosure.

3. The repositionable shelf-mounted handle spool assembly of claim 1, wherein the handle spool assembly is configured for use in a vertical cable manager.

4. The repositionable shelf-mounted handle spool assembly of claim 1, wherein the spool head is a gate arm.

5. The repositionable shelf-mounted handle spool assembly of claim 4, wherein the gate arm is mounted perpendicularly relative to the cylindrical shaft.

6. The repositionable shelf-mounted handle spool assembly of claim 1, wherein the base, the shaft, and the spool head are integrally formed.

7. The repositionable shelf-mounted handle spool assembly of claim 1, wherein the repositionable spool is rotatable relative to the mounting bracket to reposition the spool.

8. The repositionable shelf-mounted handle spool assembly of claim 7, wherein rotation of the repositionable spool is indexed as the bosses engage recesses of the spool opening.

9. The repositionable shelf-mounted handle spool assembly of claim 8, wherein the repositionable spool is repositionable to at least four rotational orientations.

10. A repositionable shelf-mounted handle spool assembly for cable routing, comprising:
    a. a mounting bracket; and
    b. a repositionable spool, coupled to the mounting bracket, including:
       (i) a base,
       (ii) a cylindrical shaft extending from the base, and
       (iii) a spool head extending from a distal end of the cylindrical shaft;
    c. wherein the mounting bracket includes a spool opening that receives the base;
    d. wherein the base includes a cylindrical stub at an end thereof, the cylindrical stub including one or more resilient bosses arranged circumferentially therearound, each boss being depressable radially inwardly relative to the cylindrical stub for fitting the repositionable spool to the mounting bracket; and
    e. wherein the repositionable spool is repositionable relative to the mounting bracket.

11. The repositionable shelf-mounted handle spool assembly of claim 9, wherein the handle spool assembly is configured for use in an electronic equipment enclosure.

12. The repositionable shelf-mounted handle spool assembly of claim 9, wherein the handle spool assembly is configured for use in a vertical cable manager.

13. The repositionable shelf-mounted handle spool assembly of claim 9, wherein the spool head is a gate arm.

14. The repositionable shelf-mounted handle spool assembly of claim 13, wherein the gate arm extends perpendicularly from the cylindrical shaft.

15. The repositionable shelf-mounted handle spool assembly of claim 9, wherein the base, the shaft, and the spool head are integrally formed.

16. The repositionable shelf-mounted handle spool assembly of claim 9, wherein the repositionable spool is rotatable relative to the mounting bracket to reposition the repositionable spool.

17. The repositionable shelf-mounted handle spool assembly of claim 16, wherein rotation of the repositionable spool is indexed at different rotational orientations.

* * * * *